US008392776B2

(12) United States Patent
Ito et al.

(10) Patent No.: US 8,392,776 B2
(45) Date of Patent: Mar. 5, 2013

(54) DELAY FAULT DIAGNOSIS PROGRAM

(75) Inventors: Daisuke Ito, Hamura (JP); Hiroki Yamanaka, Kunitachi (JP); Yasuo Sato, Iizuka (JP)

(73) Assignee: Hitachi, Ltd., Tokyo (JP)

( * ) Notice: Subject to any disclaimer, the term of this patent is extended or adjusted under 35 U.S.C. 154(b) by 268 days.

(21) Appl. No.: 12/761,335

(22) Filed: Apr. 15, 2010

(65) Prior Publication Data

US 2010/0269003 A1 Oct. 21, 2010

(30) Foreign Application Priority Data

Apr. 16, 2009 (JP) ................................. 2009-099522

(51) Int. Cl.
*G01R 31/28* (2006.01)

(52) U.S. Cl. .......................... 714/731; 714/729; 714/736

(58) Field of Classification Search .................. 714/731, 714/738, 726, 727, 729, 733, 734, 736, 741, 714/744

See application file for complete search history.

(56) References Cited

U.S. PATENT DOCUMENTS

| 7,249,300 B2 * | 7/2007 | Chung et al. .................. 714/726 |
| 7,516,383 B2 | 4/2009 | Hirano |
| 7,613,971 B2 * | 11/2009 | Asaka ............................ 714/731 |
| 7,984,350 B2 * | 7/2011 | Hamada ........................ 714/731 |
| 8,051,352 B2 * | 11/2011 | Lin et al. ....................... 714/738 |
| 2002/0124218 A1 * | 9/2002 | Kishimoto .................... 714/738 |
| 2003/0101399 A1 * | 5/2003 | Yoshikawa .................... 714/744 |
| 2004/0015801 A1 * | 1/2004 | Mielke et al. .................... 716/6 |

FOREIGN PATENT DOCUMENTS

JP 2007-108863 A 4/2007

OTHER PUBLICATIONS

Rearick, J.; , "Too much delay fault coverage is a bad thing," Test Conference, 2001. Proceedings. International , vol., no., pp. 624-633, 2001.*
Saxena, J.; Butler, K.M.; Gatt, J.; Raghuraman, R.; Kumar, S.P.; Basu, S.; Campbell, D.J.; Berech, J.; , "Scan-based transition fault testing—implementation and low cost test challenges," Test Conference, 2002. Proceedings. International , vol., no., pp. 1120- 1129, 2002.*
Goncalves, F.M.; Teixeira, I.C.; Teixeira, J.P.; , "Integrated approach for circuit and fault extraction of VLSI circuits," Defect and Fault Tolerance in VLSI Systems, 1996. Proceedings., 1996 IEEE International Symposium on , vol., no., pp. 96-104, Nov. 6-8, 1996.*

* cited by examiner

*Primary Examiner* — Cynthia Britt
(74) *Attorney, Agent, or Firm* — Miles and Stockbridge P.C.

(57) ABSTRACT

An extraction unit of fault assumption and a finish-point FF is provided, the fault assumption is selected from fault assumption information, and a logic trace is executed from the fault assumption toward an output side. A test result of a finish-point FF obtained as a result of the trace from the fault assumption is determined. The maximum value and the minimum value of the propagation route up to the finish-point FF are determined, and a delay margin is determined from the values. A delay range is determined by using the delay margin and the test result, and a fault candidate and a delay range of the delay fault are specified by the process of the determination of the fault candidate and the delay range.

6 Claims, 19 Drawing Sheets

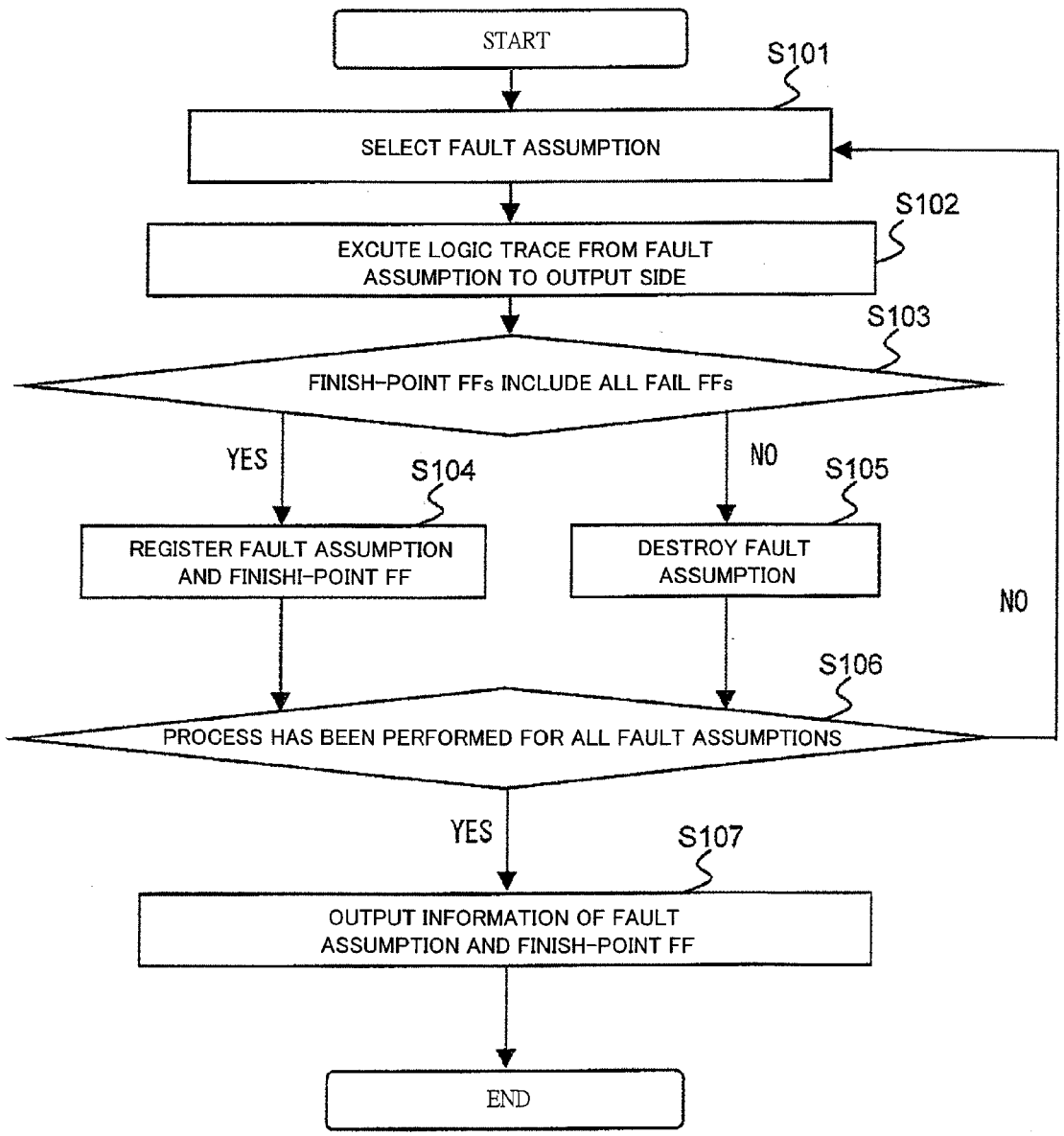

FIG. 5A
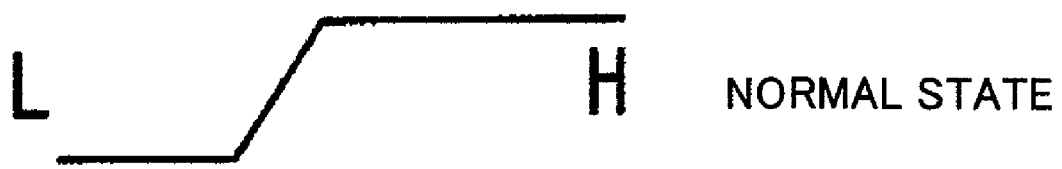
NORMAL STATE
FAULT STATE
FIG. 5B
NORMAL STATE
FAULT STATE

CASE WHERE FAULT PROPAGATES

CASE WHERE FAULT DOES NOT PROPAGATE

| FF NAME | FF301 | FF302 | FF303 |
|---|---|---|---|
| TEST RESULT | TEST PASS | TEST PASS/FAIL | TEST FAIL |

F ··· FAIL ONLY
P ··· PASS ONLY
FP ··· BOTH OF FAIL AND PASS
Tc ·· TEST TIMING

NEW COMMON RANGE OBTAINED FROM Tc3 AND Tc5

DELAY FAULT DIAGNOSIS PROGRAM

CROSS-REFERENCE TO RELATED APPLICATION

The present application claims priority from Japanese Patent Application No. 2009-099522 filed on Apr. 16, 2009, the content of which is hereby incorporated by reference into this application.

TECHNICAL FIELD OF THE INVENTION

The present invention relates to a semiconductor device, and more particularly to a fault diagnosis technique in a semiconductor device.

BACKGROUND OF THE INVENTION

A delay fault diagnosis of a semiconductor integrated circuit includes a technique of specifying a fault spot by using the information of fail/pass of a test and the fault dictionary.

Usually, a scan test method is used for the test. In the scan test method, a scan chain in which flip flops (hereinafter, referred to as FF) are connected in series is built into a semiconductor integrated circuit, and the test is carried out. A test pattern is input to the scan chain from an input terminal, and the test pattern is then propagated to a combinational circuit unit by applying a clock. The response pattern propagated to the combinational circuit unit is supplemented by the FF and is read out to an output terminal from the scan chain, and the signal level thereof is monitored by a tester. Then, the monitored response pattern and an expected value precalculated and stored in a memory of the tester are compared to each other, and it is determined as a pass if they match and determined as a fail if not. The expected value is calculated for all the FFs which make up the scan chain, and therefore, information as to which FF is determined as a pass or a fail can also be obtained. A series of these operations is executed for every test pattern, and the FF determined as a pass is referred to as a pass FF relating to the test pattern, and the FF determined as a fail is referred to as a fail FF relating to the test pattern.

The fault dictionary is obtained by a logic simulation using a computer as to which FF fails or passes for each applied test pattern when the fault exists in the semiconductor integrated circuit. When the FF fails, it means that the influence of the fault propagates to the FF and can be monitored by the tester. Also, when the FF passes, it means that the influence of the fault cannot be monitored. In the fault dictionary, a spot where a fault model is assumed is referred to as a fault assumption. Hence, the information contained in the fault assumption is a spot where the fault is assumed and an assumed fault model. The fault dictionary stores the information of pass/fail of all the FFs for every fault assumption.

In the fault diagnosis using the fault dictionary, the pass/fail information of all the FFs monitored by the tester for every test pattern and the pass/fail information of all the FFs of the fault assumption stored in the fault dictionary are collated, and the matched fault assumption is taken as a fault candidate. Even if not completely matched, the fault candidate having the high possibility of being a real fault is specified by weighting the matching degree.

In a delay fault diagnosis, the fault dictionary is prepared by assuming a delay fault. The delay fault means that a signal does not propagate within a "set time" and causes a logical malfunction in the semiconductor integrated circuit. Usually, a clock cycle determined by a clock operation frequency of the semiconductor integrated circuit corresponds to the "set time". Hence, a logical state, in which the transition of a signal generated at a specific logical node delays due to the influence of the fault and therefore the propagation does not arrive at the FF to be observed within the set time, so that the signal transition is not observed at the FF, is modeled as the fault model of the delay fault. More specifically, a fall fault in which the logic level is left at H at the spot where the logic level of the signal makes a transition from H (high level) to L (low level) and a rise fault in which the logic level is left at L at the spot where the signal makes a transition from L to H are handled.

U.S. Pat. No. 7,516,383 (Patent Document 1) is cited as an example that describes the delay fault diagnosis. In the fault diagnosis technique disclosed in Patent Document 1, first, a trace is performed from the fail FF to the input side, thereby narrowing down the fault candidate. Then, the delay fault is assumed for the narrowed-down candidate, and the logical simulation is performed for the candidate. Finally, the pass/fail information obtained by the simulation and the pass/fail information by the test are collated, thereby specifying the fault spot.

SUMMARY OF THE INVENTION

As shown in the description of the conventional art, the delay fault model used for the conventional delay fault uses a model in which a normal signal transition does not occur at the spot where the fault is assumed, and does not give any consideration to the delay value of the signal transition. However, in the delay fault in the actual semiconductor integrated circuit, the delay of the signal transition of the fault spot is not infinite, but has some magnitude. Therefore, the fault is observed or not observed at the FF in some cases depending on the length of the route through which the influence of the fault propagates. More specifically, since there is only a small margin for the clock cycle of the actual operation in the propagation route having a large delay value, the influence even by a minute delay fault can be monitored at the FF. On the other hand, since there is a large margin for the clock cycle of the actual operation in the propagation route having a small delay value, the minute delay fault cannot be monitored at the FF, and the fault dictionary of the delay fault and the result of the test are not matched with each other in some cases. Since the fault diagnosis specifies the fault spot based on the matching degree between the fault dictionary and the fail information, the fault spot cannot be specified with high precision by the fault dictionary of the delay fault which is obtained by the model not giving any consideration to the delay value of the propagation route.

An object of the present invention is to specify the fault spot with high precision by taking the delay value of the propagation route into consideration.

An outline of the representative aspect of the invention disclosed in the present application will be briefly described as follows. That is, a fault assumption is taken out from a semiconductor integrated circuit, a logic circuit from the fault assumption to a FF on an output side is extracted, delay values of all the propagation routes passing through the fault assumption from a FF on an input side of the fault assumption and arriving at the FF on the output side are calculated, the maximum value and the minimum value are extracted from the delay values of the propagation routes, a delay margin is calculated from the maximum value and the minimum value of the delay values of the propagation routes, and the delay margin and the test result of the semiconductor integrated circuit are compared to extract the delay range of the delay fault. By performing this operation for every test pattern, a plurality of delay ranges are determined for the fault assumption, and by superposing these delay ranges, whether the fault assumption is a true fault spot is determined by the computer.

The effects obtained by typical embodiments of the present invention will be briefly described below. That is, according to the fault diagnosis program of the present invention, the delay fault spot in the semiconductor integrated circuit can be easily discovered.

BRIEF DESCRIPTIONS OF THE DRAWINGS

FIG. 4 shows the detail of the extraction of the fault assumption and the finish-point FF which is a part of the process of the delay fault diagnosis program;

FIG. 5A shows a fault model of the delay fault;

FIG. 5B shows a fault model of the delay fault;

DESCRIPTIONS OF THE PREFERRED EMBODIMENTS (First Embodiment)
<Execution Environment of Hardware>

Figure 1:
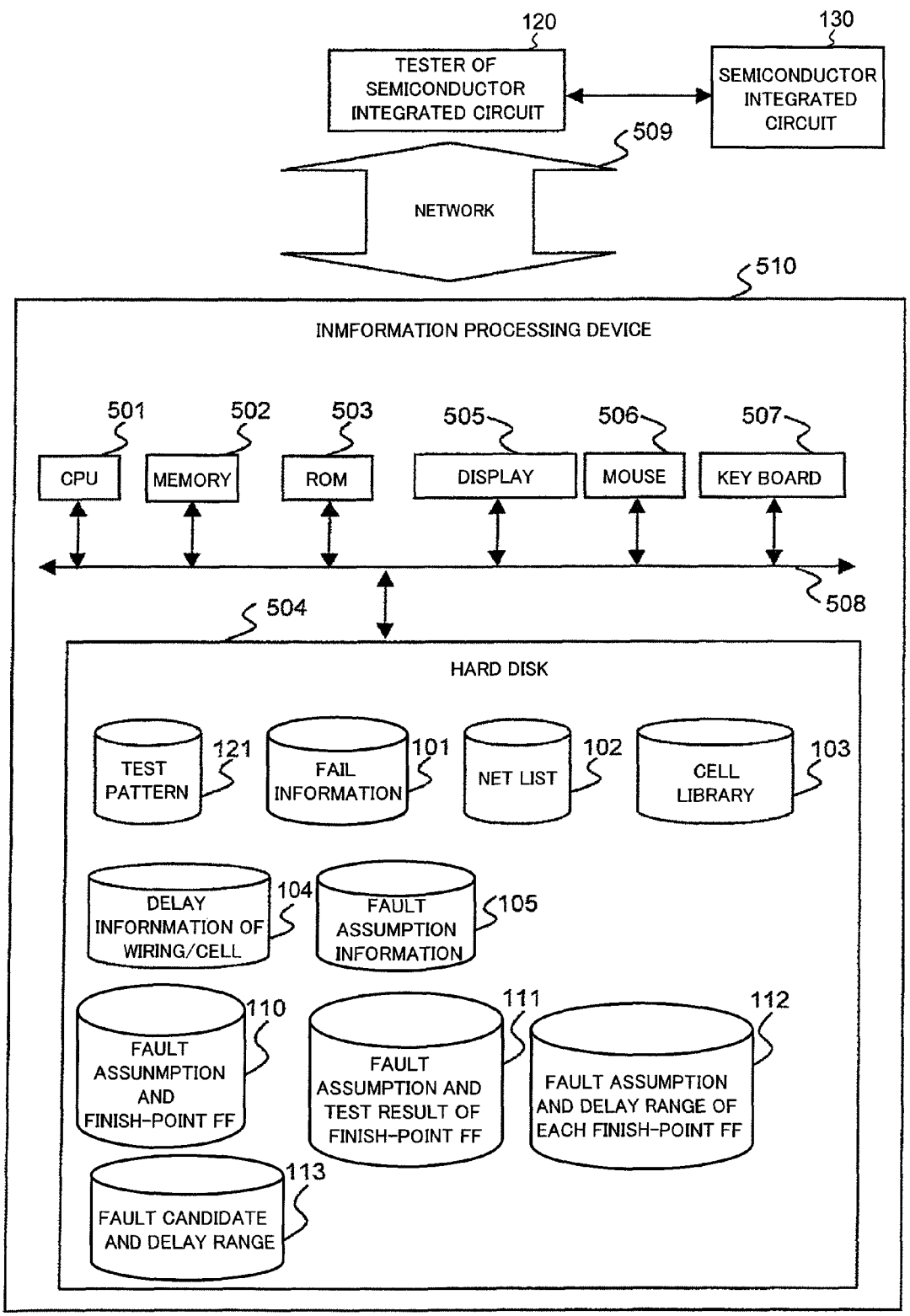
FIG. 1 shows an environment of hardware to execute a delay fault diagnosis program.

FIG. 1 shows an environment of hardware to execute a delay fault diagnosis program according to the present invention. This hardware is made up of a semiconductor integrated circuit 130, a tester 120 of the semiconductor integrated circuit, a network 509, and an information processing device 510. The information processing device includes a CPU 501, a memory 502, a ROM 503, a hard disk 504, a display 505, a mouse 506, a key board 507, and a bus 508 connecting these components. The tester 120 and the information processing device 510 are connected through the network 509.

The tester 120 of the semiconductor integrated circuit performs a test of the semiconductor integrated circuit 130. The CPU 501 performs calculation of the program execution process. The memory 502 is a work space for storing the information necessary for the calculation of the CPU 501. The ROM 503 stores data of the program. The display 505 outputs the execution result of the program. A program executer can see the execution result of the program through the display 505. The mouse 506 is an interface by which the program user gives a command to the program. The command using the mouse 506 is reflected on the display 505. The key board 507 is an interface by which the program executor gives a command to the program. The command using the key board 507 is reflected on the display. The mouse 506 and the key board 507 can be replaced by an interface using a touch panel. The respective devices are connected to each other with the bus 508, and can mutually transmit and receive the data. The bus 508 can transmit and receive the data with other devices through the network 509. For example, fail information 101 output from the tester 120 of the semiconductor integrated circuit and a test pattern 121 stored in the tester 120 are stored in the hard disk 504 through the network 509.

The hard disk 504 stores information necessary for the execution of the program, a program execution result, and output data. Further, the hard disk 504 stores input data such as the test pattern 121, the fail information 101, a net list 102, a cell library 103, delay information 104 of wiring/cell, and fault assumption information 105 as database. Note that the fail information 101 is output when an expected value and an output value are not matched in the test of the semiconductor integrated circuit using the test pattern 121. The fail information 101 includes the information of the FF determined as a fail.

Figure 2:
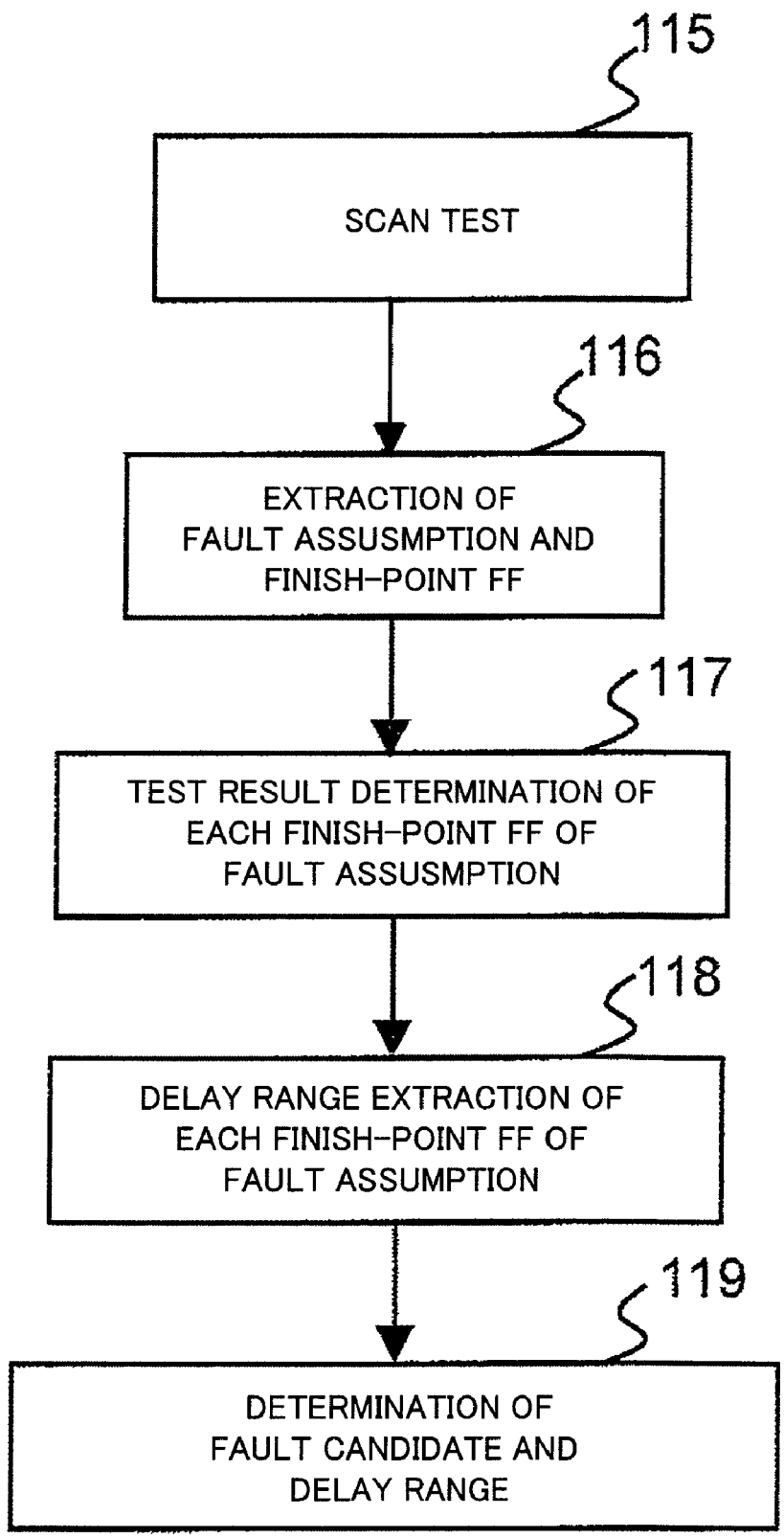
FIG. 2 shows a flow of the process of the delay fault diagnosis program.

The processes 116 to 119 described from FIG. 2 are performed in the CPU 501 and the memory 502. The program itself is stored in the ROM 503. The result of the output unit 118 is output on the display 505. The data output on the display 505 can be also stored in the hard disk 504.

<Flow of Program Process>

FIG. 2 shows an outline of the flow of the process of the present invention. At step 115, a scan test is performed for the semiconductor integrated circuit 130. At step 116, the fail information 101, the net list 102, the cell library 103, the delay information 104 of the wiring/cell, the fault assumption information 105, and the test pattern 121 are input, and the fault assumption and the finish-point FF 110 are output. At step 117, the fail information 101, the net list 102, the cell library 103, the delay information 104 of the wiring/cell, the fault assumption information 105, the test pattern 121, and the fault assumption and the finish-point FF 110 are input, and the fault assumption and a test result 111 of the finish-point FF are output. At step 118, the fail information 101, the net list 102, the cell library 103, the delay information 104 of the wiring/cell, the fault assumption information 105, the test pattern 121, and the fault assumption and the test result 111 of the finish-point FF are input, and the fault assumption and a delay range 112 of each finish-point FF are output. At step 119, the fault assumption and the delay range 112 of each finish-point FF are input, and a fault candidate and a delay range 113 are output. Each process will be described in detail later.

<Detail of Scan Test Process of Semiconductor Integrated Circuit>

Figure 3:
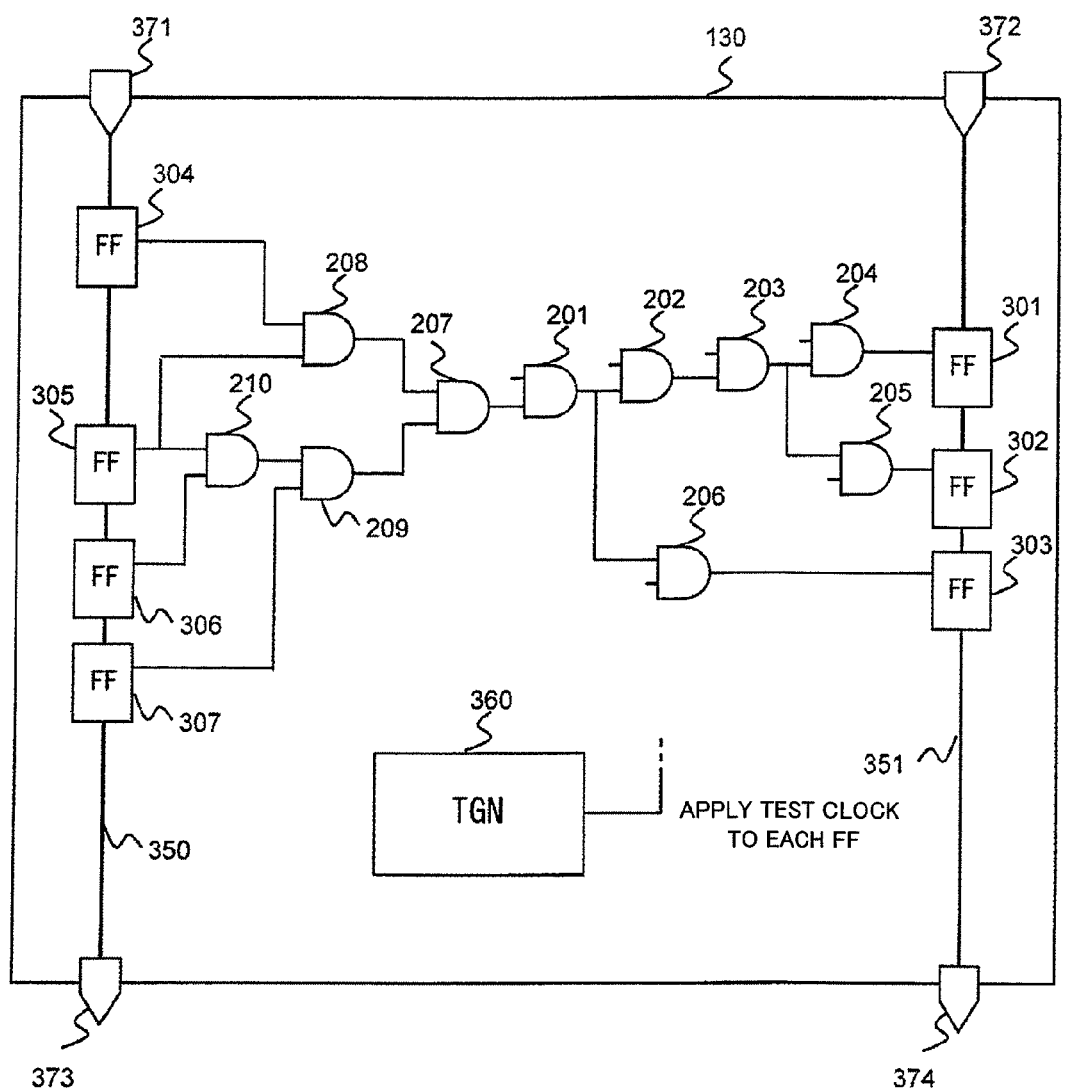
FIG. 3 shows a detail drawing of a semiconductor integrated circuit having a scan test function.

FIG. 3 shows a detail drawing of the semiconductor integrated circuit 130 having a scan test function. The semiconductor integrated circuit 130 is made up of FFs 301 to 307, scan chains 350 and 351 in which the FFs are connected in series, a test clock generation circuit (TGN) 360 supplying a test clock to each FF, input and output terminals 371 to 374 of the scan chains, and combinational circuits 201 to 210 to be tested.

The detail of the scan test operation will be described below. First, the test pattern is applied to each of the FFs 301 to 307 through the input terminals 371 and 372 of the scan chains from the tester 120. Next, the test clock is applied to each of the FFs from the test clock generation circuit (TGN) 360 and the test patterns of the FFs are propagated to the combinational circuits 201 to 210. Thereafter, the test clock is applied again, and the test patterns after passing through the combinational circuits are taken in the FFs. The taken test patterns are taken out from the output terminals 373 and 374 of the scan chains, and are compared with the precalculated expected value. When the compared values are matched, the result is determined as test pass, and when not matched, determined as test fail. Further, the time interval between the two test clocks is referred to as test timing. Note that the test timing can be changed by controlling the test clock generation circuit 360 from the tester 120.

<Detail of Processes of Extraction of Fault Assumption and Finish-point FF>

The detail of the extraction 116 of the fault assumption and the finish-point FF will be described below.

FIG. 4 shows the detail of the process of the extraction 116 of the fault assumption and the finish-point FF of FIG. 2. The information necessary for executing the process of FIG. 4 is the fail information 101, the net list 102, the cell library 103, the delay information 104 of the wiring/cell, the fault assumption information 105, and the test pattern 121 shown in FIG. 1, and they are stored in the hard disk 504. The process of the extraction 116 of the fault assumption and the finish-point FF shown in FIG. 4 is performed in the CPU 501 and the memory 502, and the fault assumption and the finish-point FF 110 which are the output information are stored in the hard disk 504. Also, the output information can also be output through the display 505. When executing the extraction 116 of the fault assumption and the finish-point FF, the program executer can issue a command through the mouse 506 and the key board 507. The command mentioned here is a command to start the program, and the program itself operates automatically. The process of FIG. 4 will be described below in detail.

First, the selection of the fault assumption is performed (S101). An arbitrary fault assumption is selected from the fault assumption information 105. The fault assumption is to assume a fault model obtained by replacing the malfunction of the semiconductor integrated circuit by a logical model at the input and output terminals of each logical gate. FIGS. 5A and 5B show the fault models of the delay fault. The fault model of the delay fault includes two types, and one type is the state in which the timing by which the signal level L makes a transition to H is slower than the normal state as shown in FIG. 5A, and the other type is the state in which the timing by which the signal level H makes a transition to L is slower than the normal state as shown in FIG. 5B. Each of these fault models is assumed at the terminal of the logical gate. Hence, the fault assumption has the information of assumed fault model and terminal name. The fault assumption is performed for the terminal of each logical gate at the time of the test pattern generation.

Next, a logic trace is performed toward the output side from the selected fault assumption until arriving at the input terminal of the FF (S102). The logic trace is the tracing of the propagation route of the signal from wire-connection information of the semiconductor integrated circuit. The FF obtained by the logic trace is referred to as a finish-point FF of the fault assumption. Since the logic trace is performed for all the circuits on the output side from the fault assumption, there are a plurality of finish-point FFs in some cases. A specific example in which the logic trace is executed toward the output side will be described with reference to FIG. 6.

Figure 6:
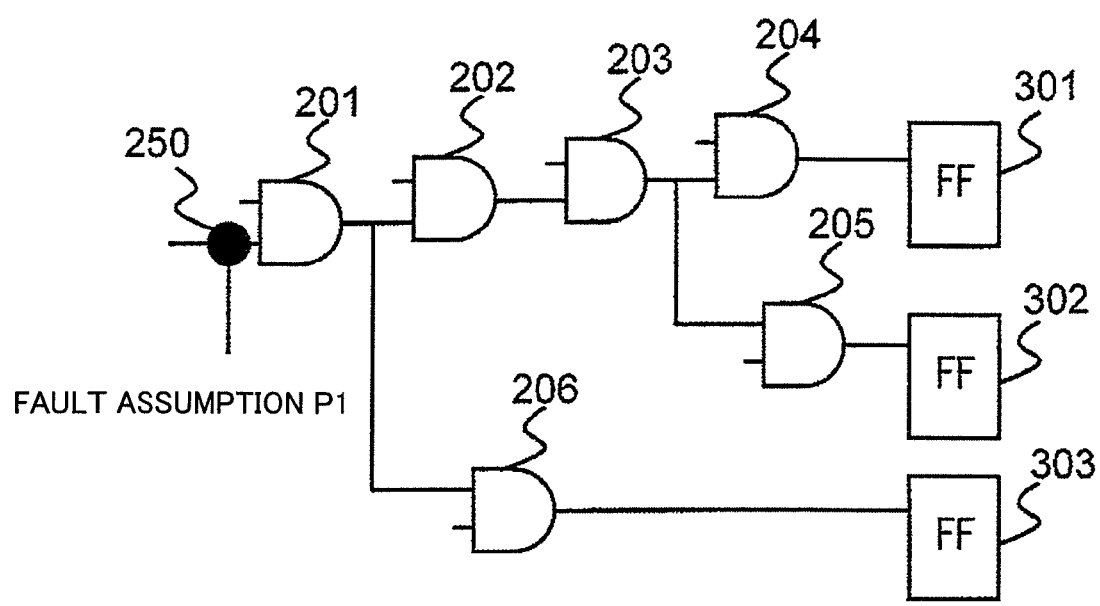
FIG. 6 shows an example of executing a logic trace from a selected fault assumption toward the output side.

FIG. 6 shows an example of executing the logic trace from a selected fault assumption to the output side. FIG. 6 is made up of a fault assumption P1 (250), logic elements 201 to 206, and finish-point FFs 301 to 303. Input terminals of the logic elements are traced from the fault assumption P1 (250) toward the output side. When the logic trace arrives at the input terminal of the logic element 201, the trace is performed again from the output terminal of the logic element 201 to the input terminal of the next logic element. This trace is repeated until arriving at the input terminal of the FF. In the case of the fault assumption P1 (250) of FIG. 6, three finish-point FFs 301 to 303 can be obtained.

Next, the finish-point FF and the fail FF of the fail information 101 are collated, and whether the fail FFs are all included in the finish-point FFs is determined (S103). When the fail FFs are all included in the finish-point FFs, YES at S103 is selected, and the selected fault assumption and its finish-point FF are registered (S104). When the all fail FFs are not included in the finish-point FFs, the process proceeds to NO at S103, and the selected fault assumption is destroyed (S105). When the process at S104 or S105 is completed, whether the processes at S102 to S104 or S105 have been performed for all the fault assumptions is determined (S106). When the processes have been performed for all the fault assumptions, the process proceeds to YES at S106, and the information of the fault assumption and the finish-point FF is output (S107). The information output here corresponds to the fault assumption and the finish-point FF 110 of FIG. 1, and is used for the test result determination 117 of each finish-point FF of the fault assumption. When the process has not been performed for all the fault assumptions, the process proceeds to NO at S106, and the process is executed again from S101. The extraction 116 of the fault assumption and the finish-point FF is completed by the process at S107.

<Detail of Process of Test Result Determination of Each Finish-point FF of Fault Assumption>

The detail of the test result determination 117 of each finish-point FF of the fault assumption will be described below.

Figure 7:
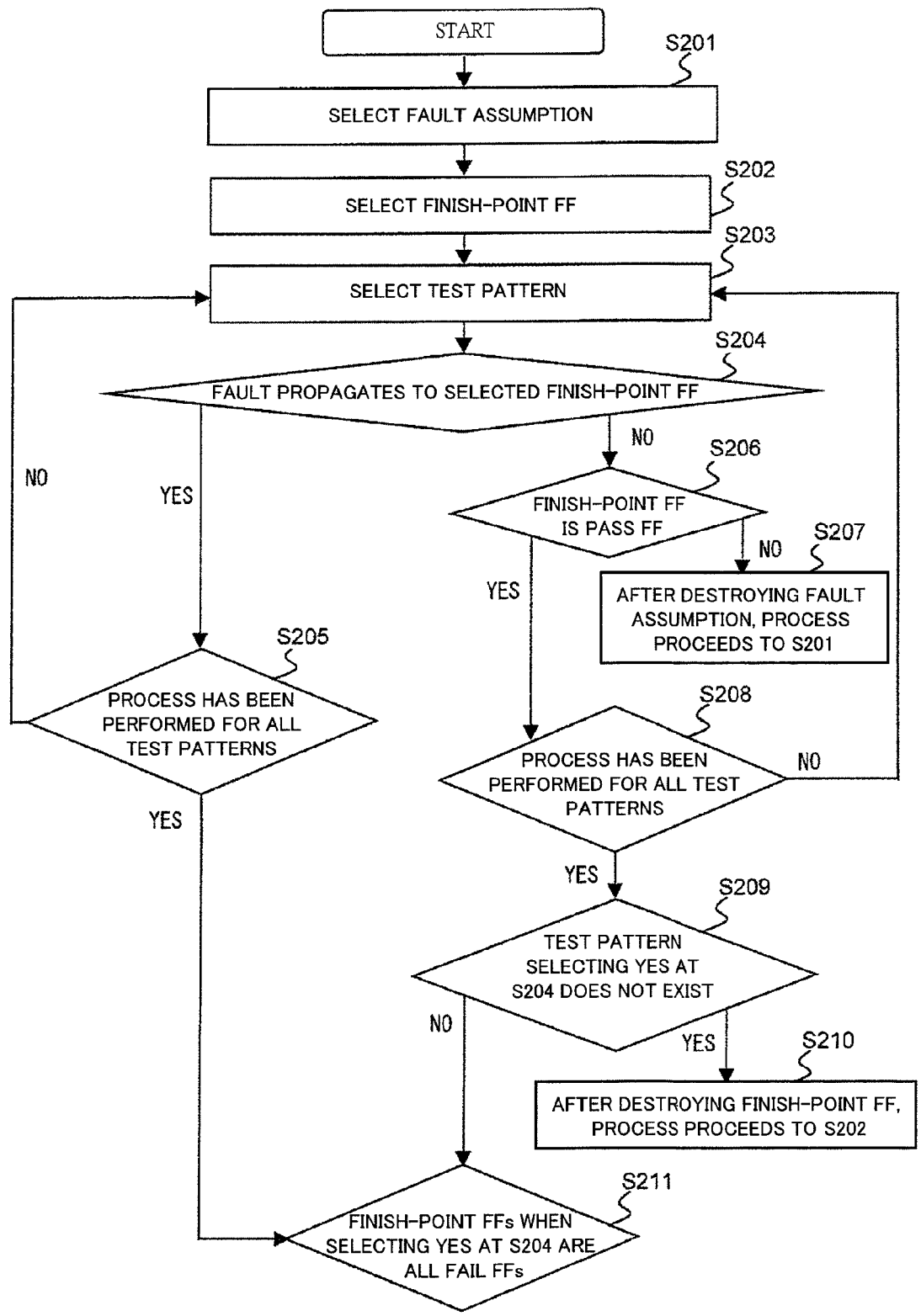
FIG. 7 shows a first-half process of the test result determination of each finish-point FF of the fault assumption which is a part of the process of the delay fault diagnosis program.
Figure 8:
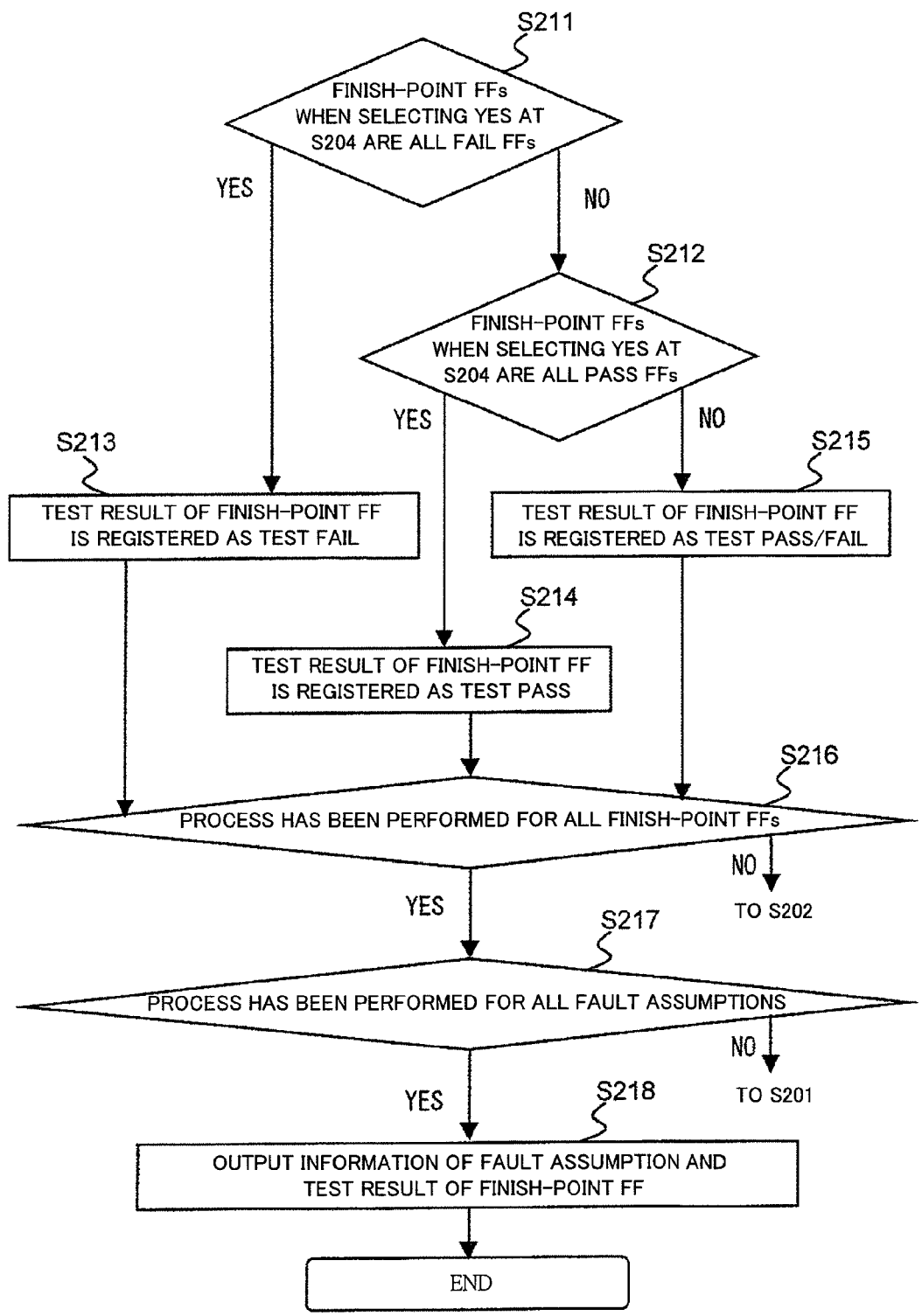
FIG. 8 shows a last-half process of the test result determination of each finish-point FF of the fault assumption which is a part of the process of the delay fault diagnosis program.

FIGS. 7 and 8 show the detail of the process of the test result determination 117 of each finish-point FF of the fault assumption of FIG. 2. FIG. 7 shows the processes up to the step S211, and FIG. 8 shows the processes from the step S211. The information necessary for executing the processes of FIGS. 7 and 8 is the fail information 101, the net list 102, the cell library 103, the delay information 104 of the wiring/cell, the fault assumption information 105, the test pattern 121, and the fault assumption and the finish-point FF 110 shown in FIG. 1, and they are stored in the hard disk 504. The process is performed in the CPU 501 and the memory 502, and the fault assumption and the test result 111 of the finish-point FF which are the output information are stored in the hard disk 504. Further, the output information can also be output through the display 505. The process of FIGS. 7 and 8 will be described below in detail.

First, one fault assumption is selected from the fault assumption and the finish-point FF 110 (S201). Next, one finish-point FF is selected from the finish-point FFs of the selected fault assumption (S202). Next, a test pattern is selected from the test patterns 121 (S203).

Next, whether the fault propagates to the selected finish-point FF is determined (S204). The fault handled here is the rise fault and the fall fault explained in the description of the conventional art. The propagation of the fault means that the influence of the fault of the fault assumption arrives at the finish-point FF by means of the given test pattern. A specific example in which the fault propagates to the finish-point FF will be described with reference to FIGS. 9A and 9B.

Figure 9A:
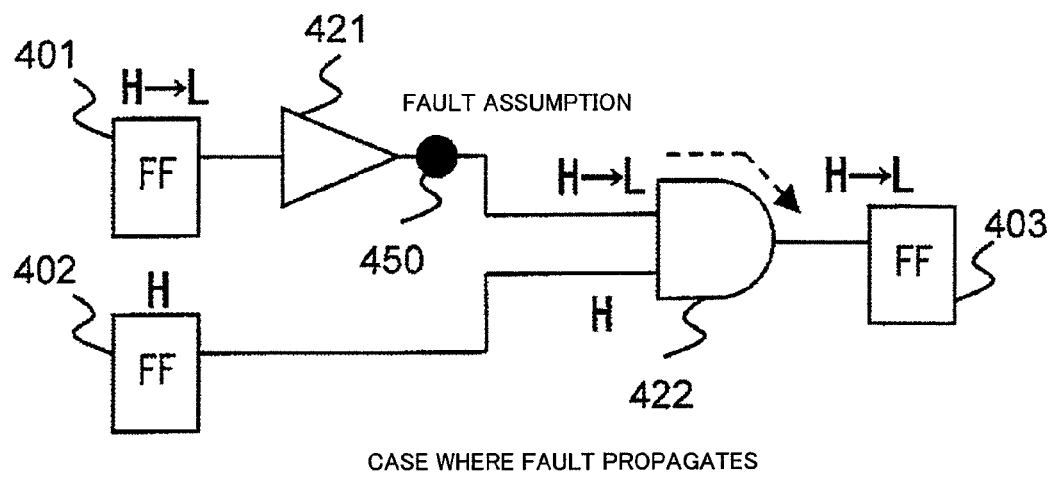
FIG. 9A shows an example in which the fault propagates to the finish-point FF.
Figure 9B:
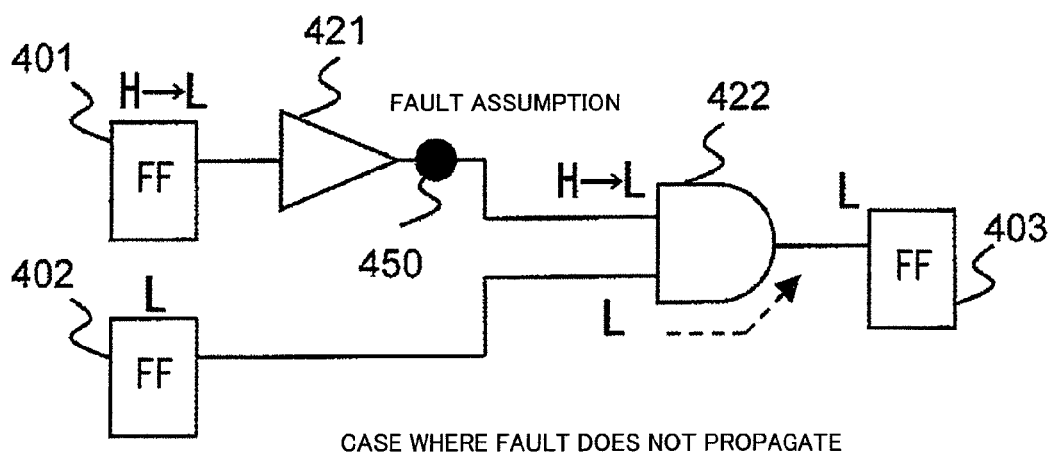
FIG. 9B shows an example in which the fault does not propagate to the finish-point FF.

FIGS. 9A and 9B show examples in which the fault propagates and does not propagate to the finish-point FF. FIGS. 9A and 9B are made up of FFs 401 to 403, logic elements 421 and 422, and a fault assumption 450. The logic element 421 outputs an input signal level as it is. Specifically, when H is input, H is output, and when L is input, L is output. The logic element 422 is a 2-input AND circuit. The AND circuit outputs H when both of the two input signals are H, and outputs L when one of the two input signals is L or when both of the two signals are L. The position of the fault assumption 450 is an output of the logic element 421, and the fault model is the fall fault shown in FIG. 5B. The FF 403 is the finish-point FF of the fault assumption 450. Signal levels which are set to the FFs 401 and 402 by the selected test pattern are shown above the FFs 401 and 402 in FIGS. 9A and 9B.

First, the case where the fault propagates shown in FIG. 9A will be described. It is assumed that a signal which makes a transition from H to L is set to the FF 401 and a signal left at H is set to the FF 402 as the test pattern. Since the FF 401 outputs a signal which makes a transition, the signal transition occurs also in the fault assumption 450. Then, the signal transition propagates to the logic element 422. The H signal is input to the other input terminal of the logic element 422 from the FF 402, and therefore, the signal transition passes through the logic element 422, and propagates to the FF 403. Hence, the fault of the fault assumption 450 propagates to the finish-point FF 403.

Next, the case where the fault does not propagate shown in FIG. 9B will be described. It is assumed that a signal which makes a transition from H to L is set to the FF 401 and a signal left at L is set to the FF 402 as the test pattern. The signal transition of the FF 401 propagates to the logic element 422 similarly to the case of FIG. 9A. However, the L signal is input to the other input terminal of the logic element 422 from the FF 402, and therefore, the L signal propagates to the FF 403. Hence, the fault of the fault assumption 450 does not propagate to the finish-point FF 403.

As described above with reference to FIGS. 9A and 9B, whether the fault propagates to the selected finish-point FF is calculated and determined at S204.

When the fault propagates to the selected finish-point FF, the process proceeds to YES at S204, and the determination at S205 is performed. When the process at S204 is performed for all the test patterns, the process proceeds to YES and the determination at S211 is performed. The process at S211 will be described later. When the process is not performed for all the test patterns, the process proceeds to NO and the process is executed again from S203.

When the fault does not propagate to the selected finish-point FF, the process proceeds to NO at S204, and the determination at S206 is performed. A pass FF is a FF determined as a pass by the tester 120 using the selected test pattern. When the selected finish-point FF is the pass FF, the process proceeds to YES and the determination at S208 is performed.

When the selected finish-point FF is not the pass FF, the process proceeds to NO and the selected fault assumption is destroyed, and the process is executed again from S201 (S207). When the finish-point FF is not the pass FF, it means that the fail is determined at the finish-point FF to which the fault does not propagate and the pass/fail of the fail information cannot be reproduced by the selected fault assumption. Hence, the fault assumption is destroyed here.

At S208, whether the process at S204 has been performed for all the test patterns is determined similarly to S205. When the process has been performed for all the test patterns, the process proceeds to YES, and the determination at S209 is performed. When the process has not been performed for all the test patterns, the process proceeds to NO, and the process is executed again from S203.

At S209, whether the test pattern which selects YES in the process at S204 and proceeds to S205 exists is determined. When the test pattern which selects YES in the process at S204 does not exist, the process proceeds to YES, and the selected finish-point FF is destroyed, and the process is executed again from S202 (S210). When the test pattern which selects YES in the process at S204 does not exist, it means that the fault does not propagate to the finish-point FF by any test pattern. The information of the pass determination of the FF to which the fault does not propagate is not useful for specifying a fault spot, and therefore, the finish-point FF is destroyed here. When the test pattern which selects YES in the process at S204 exists, the process proceeds to NO, and the determination at S211 is performed.

The processes from S211 are shown in FIG. 8. At S211, whether the finish-point FFs when YES is selected in the process at S204 are all the fail FFs is determined. The fail FF is a FF determined as a fail by the tester 120 using the selected test pattern. When the finish-point FFs when YES is selected in the process at S204 are all the fail FFs, the process proceeds to YES, and the test result of the selected finish-point FF is registered as a test fail together with the fault assumption (S213). The test fail means that the fault assumption of the selected finish-point FF propagates to the finish-point FF, and at the same time, the selected finish-point FF becomes the fail FF for all the test patterns. When all the finish-point FFs when YES is selected in the process at S204 are not the fail FFs, the process proceeds to NO, and the determination at S212 is performed.

At S212, whether the finish-point FFs which select YES in the process at S204 are all the pass FFs is determined. When the finish-point FFs are all the pass FFs, the process proceeds to YES, and the test result of the selected finish-point FF is registered as a test pass together with the fault assumption (S214). The test pass means that the fault assumption of the selected finish-point FF propagates to the finish-point FF, and at the same time, the selected finish-point FF becomes the pass FF for all the test patterns. When all the finish-point FFs which select YES in the process at S204 are not pass FFs, the process proceeds to NO, and the test result of the selected finish-point FF is registered as a test pass/fail together with the fault assumption (S215). The test pass/fail means that the fault assumption of the selected finish-point FF propagates to the finish-point FF, and at the same time, the selected finish-point FF becomes the pass FF or the fail FF depending on the test patterns.

Next to the processes at S213, S214, and S215, whether the process has been performed for all the finish-point FFs is determined (S216). When the process has been performed for all the finish-point FFs, the process proceeds to YES, and the determination at S217 is performed. When the process has not been performed for all the finish-point FFs, the process proceeds to NO, and the process is executed again from S202.

At S217, whether the process has been performed for all the fault assumptions is determined. When the process has been performed for all the fault assumptions, the process proceeds to YES, and the information of the fault assumption and the test result of the finish-point FF is output (S218). When the process has not been performed for all the fault assumptions, the process proceeds to NO, and the process is executed again from S201. The information output here corresponds to the fault assumption and the test result 111 of the finish-point FF of FIG. 1, and is used for a delay range extraction 118 of each finish-point FF of the fault assumption. The process of the test result determination 117 of each finish-point FF of the fault assumption is completed by the process at S218.

<Detail of Process of Delay Range Extraction of Each Finish-Point FF of Fault Assumption>

The detail of the delay range extraction 118 of each finish-point FF of the fault assumption will be described below.

Figure 10:
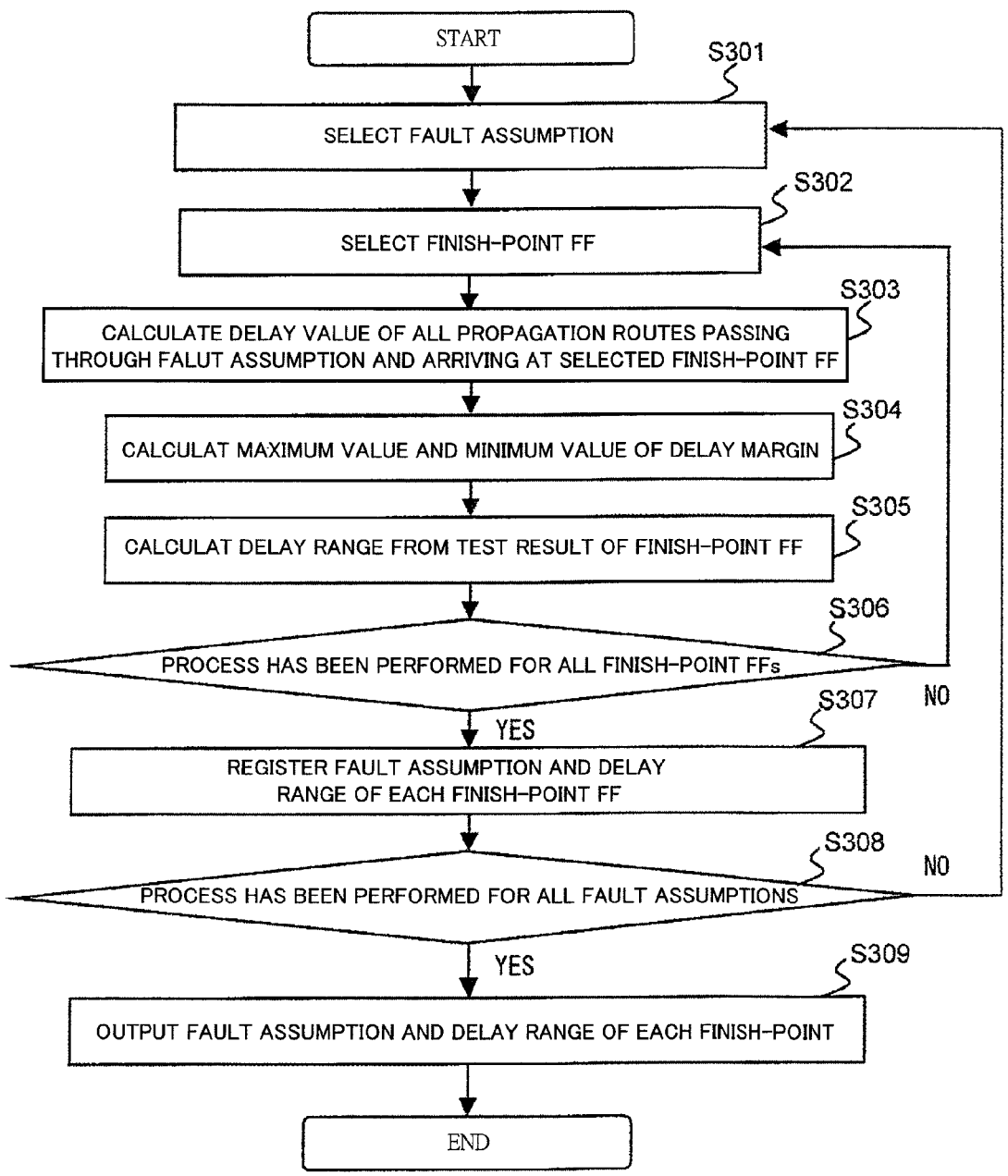
FIG. 10 shows the detail of the delay range extraction of each finish-point FF of the fault assumption which is a part of the process of the delay fault diagnosis program.

FIG. 10 shows the detail of the process of the delay range extraction 118 of each finish-point FF of the fault assumption of FIG. 2. The information necessary for executing the process of FIG. 10 is the fail information 101, the net list 102, the cell library 103, the delay information 104 of the wiring/cell, the fault assumption information 105, the test pattern 121, and the fault assumption and the test result 111 of the finish-point FF shown in FIG. 1, and they are stored in the hard disk 504. The process thereof is performed in the CPU 501 and the memory 502, and the fault assumption and the delay range 112 of each finish-point FF which are the output information are stored in the hard disk 504. Further, the output information can also be output through the display 505. The process of FIG. 10 will be described below in detail.

First, one fault assumption is selected from the fault assumption and the test result 111 of the finish-point FF (S301). Next, the finish-point FF is selected from the selected fault assumption (S302).

The delay values of all the propagation routes which pass though the fault assumption and arrive at the selected finish-point FF are calculated (S303). The propagation route mentioned here indicates a route from the FF serving as a start-point for outputting the signal passing through the fault assumption to the finish-point FF. The FF serving as a start-point can be obtained by tracing logic from the fault assumption toward the input side. The FF thus obtained is referred to as a start-point FF. The delay value of the propagation route can be obtained by adding up all the delay information of the wiring/cell on the route which passes through the fault assumption from the start-point FF and arrives at the finish-point FF. When there are a plurality of start-point FFs or a plurality of propagation routes from the fault assumption to the finish-point FFs, the propagation routes equal to the number of the combinations thereof exist, and therefore, the delay value is calculated for each of the propagation routes. A specific example of the processes from S301 to S303 will be described with reference to FIG. 11.

Figure 11:
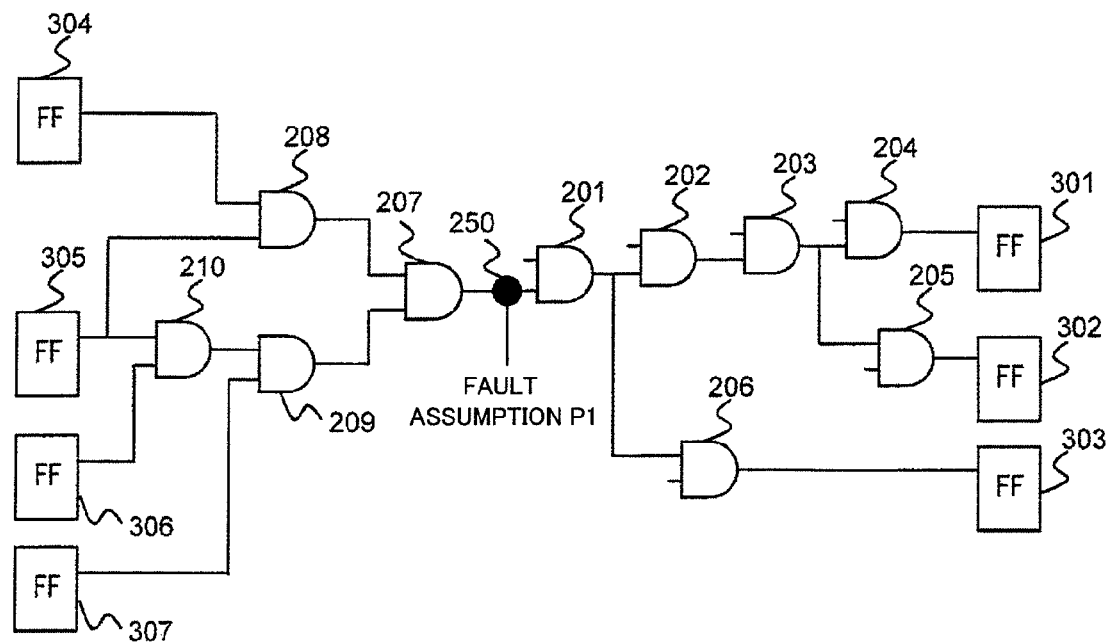
FIG. 11 shows an example of executing a logic trace from a selected fault assumption toward the input side.

FIG. 11 shows an example of executing a logic trace from the fault assumption P1 (250) of FIG. 6 toward the input side. FIG. 11 is made up of the fault assumption P1 (250), logic elements 201 to 210, the finish-point FFs 301 to 303, and start-point FFs 304 to 307. In FIG. 11, it is assumed that the fault assumption P1 (250) is selected at S301 and the finish-point FF 301 is selected at S302. In this case, the process at S303 is performed as described below. First, the output terminal of the logic circuit is traced from the fault assumption toward the input side. When the trace arrives at the output terminal of the logic element 207, the trace is performed again from the input terminal to the input of the next logic element. This is repeated until the trace arrives at the output terminal of the FF. In the case of the fault assumption P1 (250) of FIG. 11, four start-point FFs 304 to 307 can be obtained.

Next, the delay value of the propagation route is calculated. In FIG. 11, the propagation route from the fault assumption P1 (250) to the selected finish-point FF 301 is limited to the route which passes through the logic elements 201, 202, 203, and 204. On the other hand, since there are a plurality of start-point FFs 304 to 307, there are also a plurality of propagation routes to the fault assumption P1 (250), and the number of routes is five. When considering the combination thereof, the number of propagation routes passing through the fault assumption P1 (250) and arriving at the finish-point FF 301 is five shown below. The first is a propagation route 1, which passes through the logic elements 208 and 207 and the fault assumption P1 (250) from the start-point FF 304 and arrives at the finish-point FF 301, the second is a propagation route 2, which passes through the logic elements 208 and 207 and the fault assumption P1 (250) from the start-point FF 305 and arrives at the finish-point FF 301, the third is a propagation route 3, which passes through the logic elements 210, 209, and 207 and the fault assumption P1 (250) from the start-point FF 305 and arrives at the finish-point FF 301, the fourth is a propagation route 4, which passes through the logic elements 210, 209, and 207 and the fault assumption P1 (250) from the start-point FF 306 and arrives at the finish-point FF 301, and the fifth is a propagation route 5, which passes through the logic elements 209 and 207 and the fault assumption P1 (250) from the start-point FF 307 and arrives at the finish-point FF 301. When the delay information of the wiring/cell on each propagation route is added up, the delay value of the propagation route can be obtained.

Next, the maximum value and the minimum value of the delay margin are calculated (S304). The delay margin is a value obtained by subtracting the delay value of the propagation route from test timing. The test timing is a time interval of a test clock input to each FF. If a signal does not propagate from the start-point FF to the finish-point FF within this test timing, the semiconductor integrated circuit does not normally operate. If there are a plurality of propagation routes which pass through the fault assumption and arrive at the selected finish-point FF, the same number of delay margins also exist. The highest value among them is taken as the maximum value of the delay margin and defined as Tmgn_max (P, FF), and the lowest value is taken as the minimum value of the delay margin and defined as Tmgn_min (P, FF). Here, P stands for the name of the fault assumption and the FF indicates the name of the selected finish-point FF. When there is only one propagation route, the maximum value and the minimum value of the delay margin have the same value. A specific example will be described with reference to FIG. 12.

Figures 12, 13:
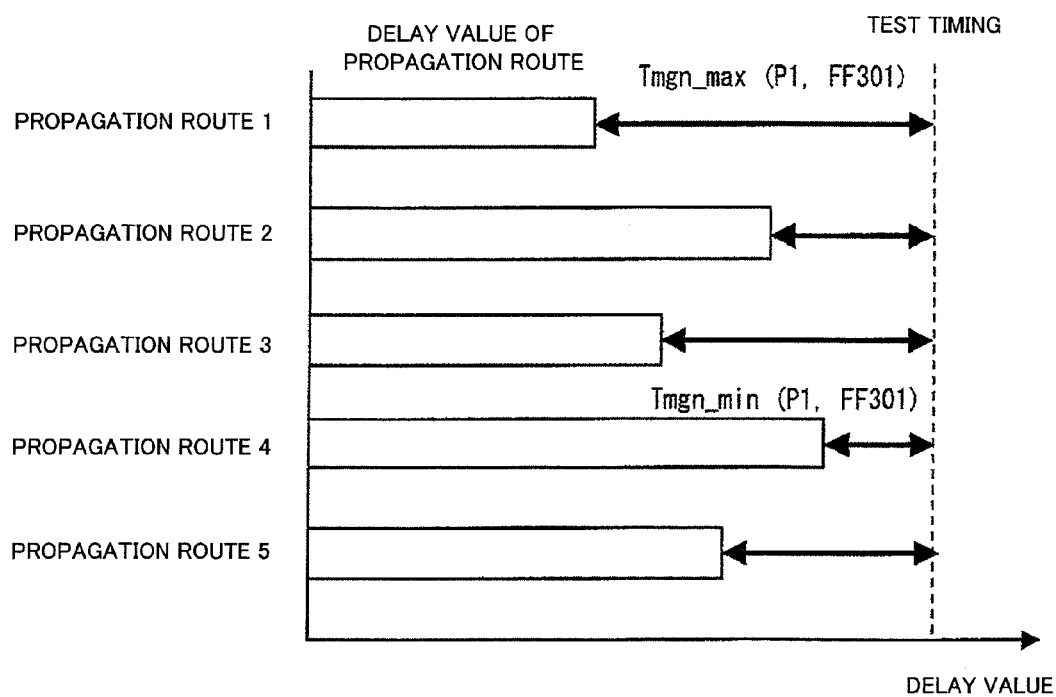
FIG. 12 shows the delay value and the delay margin of the propagation route passing through the fault assumption and arriving at the finish-point FF.
FIG. 13 shows the test result of the finish-point FFs.

FIG. 12 shows the delay values and the delay margins of the five propagation routes, which pass through the fault assumption P1 (250) and arrive at the finish-point FF 301 of FIG. 11. The delay value of each propagation route is shown by a bar graph, the delay margin is shown by an arrow, and the position of the test timing is shown by a dotted line. In FIG. 12, the propagation route 1 has the maximum value of the delay margin, and its value is defined as Tmgn_max (P1, FF 301). On the other hand, the propagation route 4 has the minimum value of the delay margin, and its value is defined as Tmgn_min (P1, FF 301).

While the method of determining the maximum value and the minimum value of the delay margin has been described above, there is also a method of determining the values by using a static timing analysis (STA) which is the conventional technique. In the case of the STA, the delay margin is referred to as a slack. Hence, the maximum value and the minimum value of the slack of all the propagation routes which pass through the fault assumption and arrive at the designated FF may be determined and used for the present invention.

Next, the delay range is calculated from the test result of the selected finish-point FF (S305). As the test result of the finish-point FF, the information of the fault assumption and the test result 111 of the finish-point FF is used. A method of calculating the delay range will be described below.

When the test result of the selected finish-point FF is the test pass, the delay value of the delay fault must be smaller than at least the maximum value of the delay margin. When the delay range in the case where the test result of the selected finish-point FF in the fault assumption P is the test pass is defined as Df (P, FF), the relation with the maximum value Tmgn_max (P, FF) of the delay margin is represented as follows.

$$Df(P, FF) < Tmgn\_max(P, FF)$$

When the test result of the selected finish-point FF is the test fail, the delay value of the delay fault must be larger than at least the minimum value of the delay margin. When the delay range in the case where the test result of the selected finish-point FF in the fault assumption P is the test fail is defined as Df (P, FF), the relation with the minimum value Tmgn_min (P, FF) of the delay margin is represented as follows.

$$Tmgn\_min(P, FF) < Df(P, FF)$$

When the test result of the selected finish-point FF is the test pass/fail, the delay value of the delay fault must be larger than at least the minimum value of the delay margin and the delay value of the delay fault must be smaller than at least the maximum value of the delay margin. When the delay range in the case where the test result of the selected finish-point FF in the fault assumption P is the test pass/fail is defined as Df (P, FF), the relation with the minimum value Tmgn_min (P, FF) and the maximum value Tmgn_max (P, FF) of the delay margin is represented as follows.

$$Tmgn\_min(P, FF) < Df(P, FF) < Tmgn\_max(P, FF)$$

After calculating the delay range, whether the process has been performed for all the finish-point FFs is determined (S306). When the processes from S302 to S305 have been performed for all the finish-point FFs of the fault assumption, the process proceeds to YES, and the fault assumption and the delay range of each finish-point FF are registered (S307). When there are the finish-point FFs for which the process has not been completed, the process proceeds to NO, and the process is executed again from S302. The processes up to here will be described as specific examples with reference to FIGS. 13 and 14.

FIG. 13 shows the test result of the finish-point FFs 301 to 303 shown in FIG. 11. Note that this test result is obtained from the test result determination 117 of each finish-point FF of the fault assumption of FIG. 2.

Figure 14:
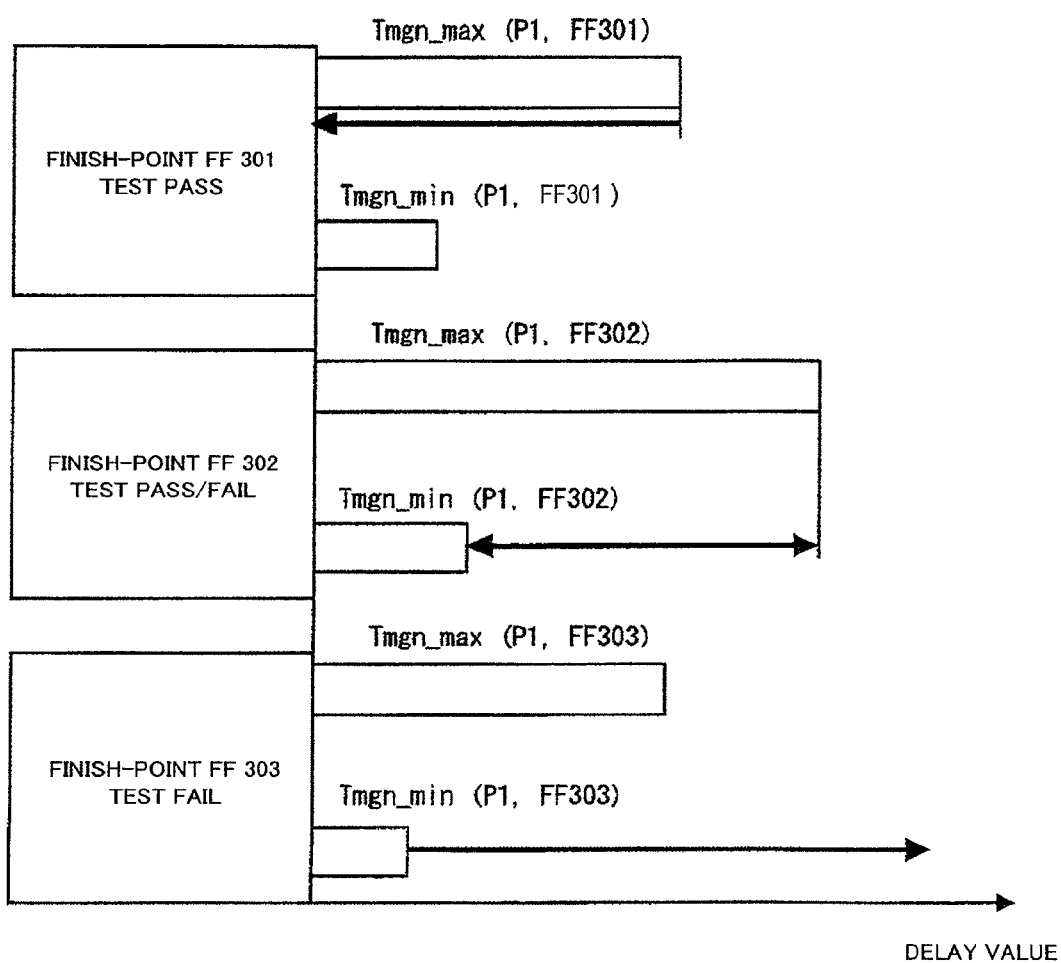
FIG. 14 shows the maximum value and the minimum value of the delay margin and the delay range of the fault assumption and the finish-point FF.

FIG. 14 shows the delay range in the case where the finish-point FFs 301 to 303 have the test result of FIG. 13. The bar graph shows the maximum value and the minimum value of the delay margin obtained as a result of the processes at S303 and S304. The arrow shows the delay range of each finish-point FF obtained as a result of the process at S305. Since the finish-point FF 301 is the test pass, the delay value of the delay fault must be smaller than at least the maximum value of the delay margin. Hence, the delay range is represented as the following expression.

$$Df(P1, FF301) < Tmgn\_max(P1, FF301)$$

Since the finish-point FF 302 is the test pass/fail, the delay value of the delay fault must be smaller than at least the maximum value of the delay margin and must be larger than at least the minimum value of the delay margin. Hence, the delay range is represented as the following expression.

$$Tmgn\_min(P1, FF302) < Df(P1, FF302) < Tmgn\_max(P1, FF302)$$

Since the finish-point FF 303 is the test fail, the delay value of the delay fault must be larger than at least the minimum value of the delay margin. Hence, the delay range is represented as the following expression.

$$Tmgn\_min(P1, FF303) < Df(P1, FF303)$$

As described above, with respect to the fault assumption P1 (250), Df (P1, FF 301), Df (P1, FF 302) and Df (P1, FF 303) are registered as the delay range of the finish-point FF.

Next to the process at S307, whether the process has been performed for all the fault assumptions is determined (S308). When the processes at S302 to S307 have been performed for all the fault assumptions registered in the fault assumption and the test result 111 of the finish-point FF, the process proceeds to YES, and the fault assumption and the delay range of each finish-point FF are output (S309). The fault assumption and the delay range of each finish-point FF output here correspond to the fault assumption and the delay range 112 of each finish-point FF of FIG. 1, and are used for the determination 119 of a fault candidate and a delay range. The process of the extraction 118 of the delay range of each finish-point FF of the fault assumption is completed by the process at S309. When the fault assumption which has not been processed yet exists, the process proceeds to NO, and the process is executed again from S301.

<Detail of Process of Determination of Fault Candidate and Delay Range>

The detail of the determination 119 of the fault candidate and the delay range will be described below.

Figure 15:
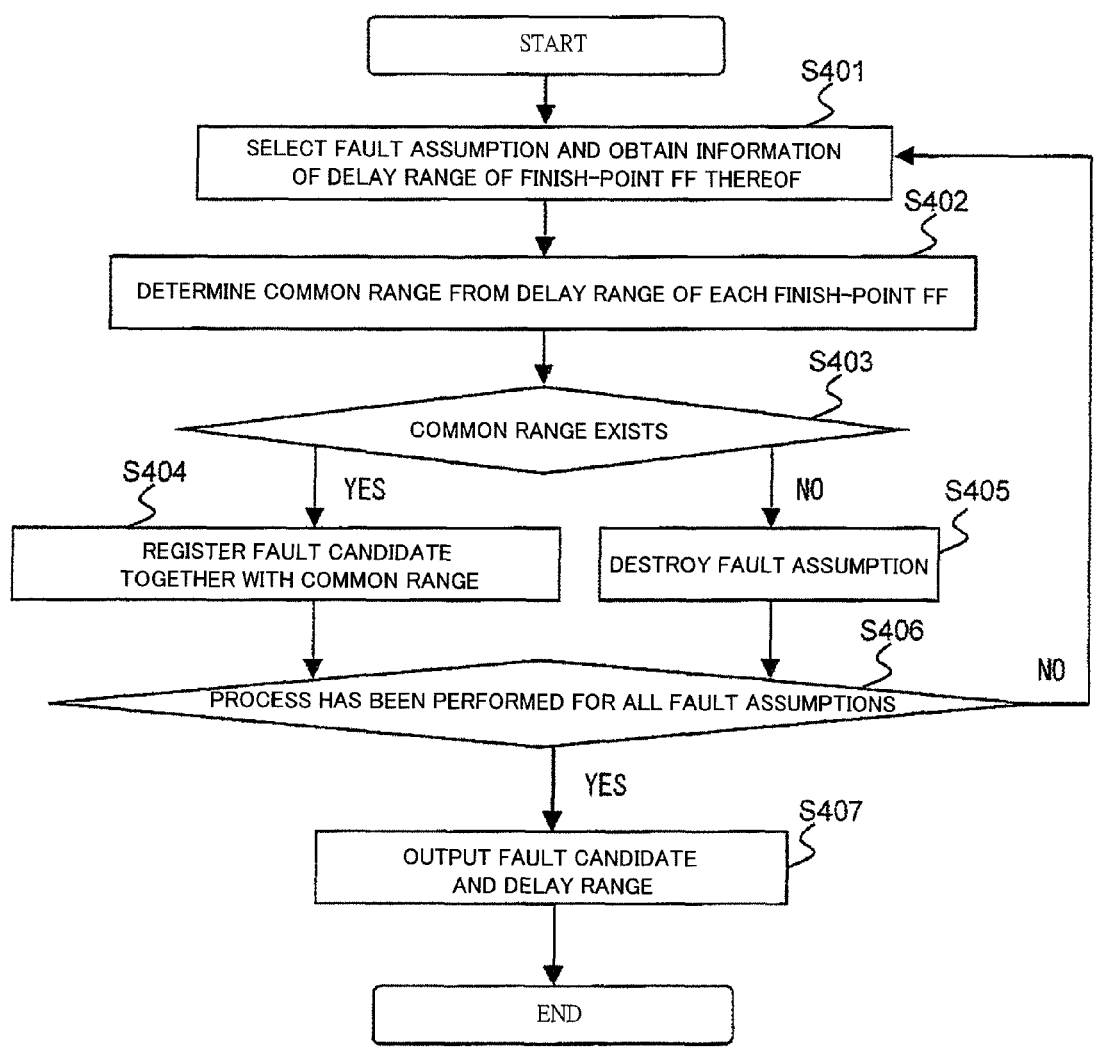
FIG. 15 shows the detail of the process of the determination of the fault candidate and the delay range which is a part of the process of the delay fault diagnosis program.

FIG. 15 shows the detail of the process of the determination 119 of the fault candidate and the delay range of FIG. 2. The information necessary for executing the process of FIG. 15 is the fault assumption and the delay range 112 of each finish-point FF shown in FIG. 1, and they are stored in the hard disk 504. The process thereof is performed in the CPU 501 and the memory 502, and the fault candidate and the delay range 113 which are the output information are stored in the hard disk 504. Further, the output information can also be output through the display 505. The process of FIG. 15 will be described below in detail.

First, the fault assumption is selected from the fault assumption and the delay range 112 of each finish-point FF, and the information of the delay range of the finish-point FF thereof is obtained (S401). When the fault assumption P1 (205) is selected here, the information as shown FIG. 14 is obtained.

Next, a common range is determined from the delay range of each finish-point FF (S402). Although the delay range of the fault assumption is decided for every finish-point FF, the delay range of the delay fault existing in the fault assumption can be determined by superposing the delay ranges of the finish-point FFs and determining the common range. The delay range of the delay fault existing in the fault assumption is defined as Df (P). P stands for the name of the fault assumption. A specific example will be described with reference to FIGS. 16 and 17.

Figure 16:
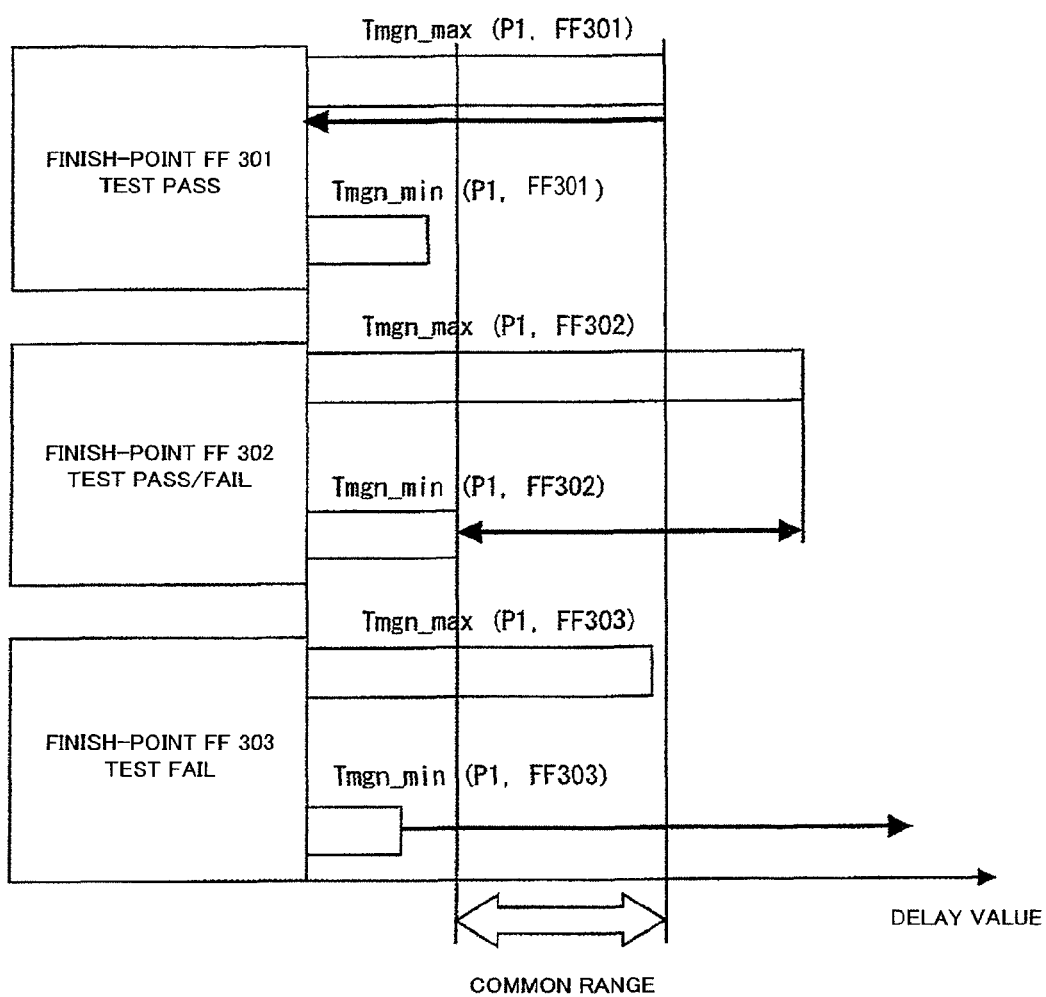
FIG. 16 shows the delay ranges of each finish-point FF of the fault assumption and the common range thereof.

FIG. 16 shows the delay range of each finish-point FF of the fault assumption P1 and the common range thereof. The bar graph shows the maximum value and the minimum value of the delay margin of each of the finish-point FFs 301 to 303, a black arrow shows the delay range of each of the finish-point FFs 301 to 303, and a white arrow shows the common range of the delay range of each of the finish-point FFs 301 to 303. The common range becomes the delay range of the delay fault in the fault assumption P1 (250). The common range is represented as the following expression.

$$Tmgn\_\min(P1,FF302) < Df(P1) < Tmgn\_\max(P1,FF301)$$

Although the common range exists in the example of FIG. 16, no common range exists depending on the fault assumption in some cases. A specific example will be described below.

Figure 17:
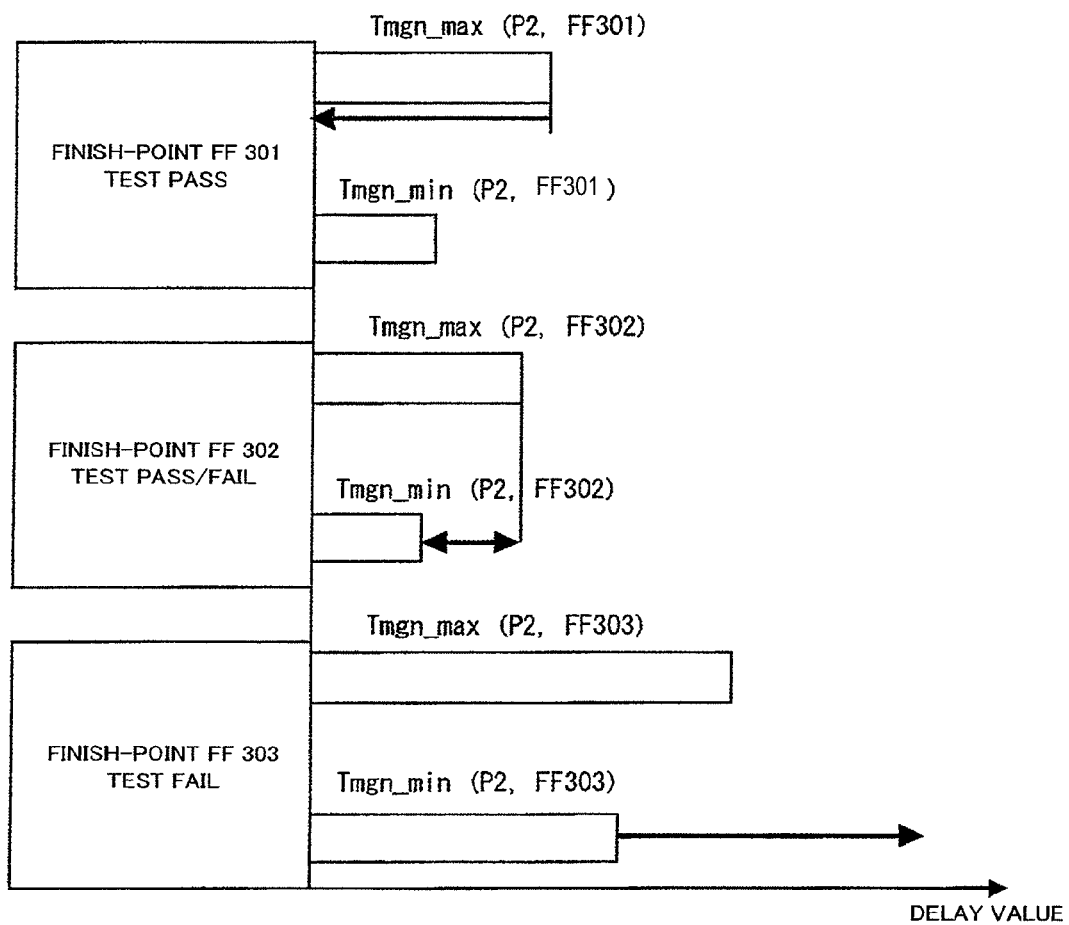
FIG. 17 shows the delay ranges of each finish-point FF of the fault assumption different from those in FIG. 16.

FIG. 17 shows the delay range of each finish-point FF of the fault assumption different from that in FIG. 16. The bar graph shows the maximum value and the minimum value of the delay margin of each of the finish-point FFs 301 to 303, and a black arrow shows the delay range of each of the finish-point FFs 301 to 303. In the case of FIG. 17, there exists no common range of the delay range. This means that the pass/fail of the fail information 101 cannot be reproduced by a fault assumption P2. Hence, it can be said that there exists no delay fault in the fault assumption P2.

After the process at s402, whether the common range exists is determined (S403). When the common range exists in the process at s402, the process proceeds to YES. The fault assumption having the common range becomes the fault candidate, and the common range becomes the delay range of the delay fault. Then, at s404, the fault candidate is registered together with the common range obtained at S403. When the common range does not exist in the process at s402, the process proceeds to NO, and the fault assumption is destroyed (S405). When the common range does not exist, it means that no delay fault exists in the fault assumption. Hence, the fault assumption is destroyed here.

Next, whether the process has been performed for all the fault assumptions is determined (S406). When the processes up to S402 to S404 or S405 have been performed for all the fault assumptions in the fault assumption and the delay range 112 of each finish-point FF, the process proceeds to YES, and the fault candidate and the delay range are output (S407). The fault candidate and the delay range output here correspond to the fault candidate and the delay range 113 of FIG. 1. The processes 116 to 119 are completed by outputting the fault candidate and the delay range 113. When the fault assumption which has not been processed yet exists, the process proceeds to NO, and the process is executed again from S401.

<Effect of First Embodiment>

In the present invention, a length of all the propagation routes from the fault assumption to the finish-point FF is calculated, and the maximum value and the minimum value of the delay margin are calculated from the test timing. Next, the delay range is calculated by using the maximum value and the minimum value of the delay margin and the test result of the finish-point FF. Hence, it is possible to specify the fault spot more precisely than the conventional delay fault diagnosis, which does not take the length of the propagation route into consideration.

Further, since the delay range of the delay fault can be also determined at the same time as the fault spot, this leads to the shortening of a fault analysis time.

(Second Embodiment)

In the first embodiment, the test is performed by fixing the test timing, and the fail information 101 obtained from the test is used. However, since the test timing can be arbitrarily set by a test executor, it is possible to obtain a lot of the fail information at different test timings. Further, when the test timing is changed, the fail information changes even in the same semiconductor integrated circuit. In the second embodiment, the fault spot is specified by using a lot of the fail information obtained at a plurality of test timings.

Figure 18:
FIG. 18 shows fail information obtained by the test at a plurality of test timings.

The second embodiment will be described below with reference to the drawings. FIG. 18 shows the fail information obtained by the test of the semiconductor integrated circuit shown in FIG. 10 at a plurality of test timings. The horizontal axis represents the magnitude of the test timing, and each cell shows the fail information of the finish-point FFs 301 to 303. The symbol F indicates a fail only, the symbol P indicates a pass only, the symbol FP indicates both of the fail and the pass, and the symbol Tc indicates the test timing. Seven test timings are used, and Tc1 is the smallest and Tc7 is the largest. Note that the test result of the test timing Tc3 is the same as the test result shown in FIG. 13. Therefore, when the fail information of Tc3 is used and the process of FIG. 2 is performed, the result as shown in FIG. 16 is obtained. Since the present embodiment is characterized by using a lot of the fail information obtained at a plurality of test timings, the fail information of the test timings Tc3 and Tc5 is used.

Figure 19:
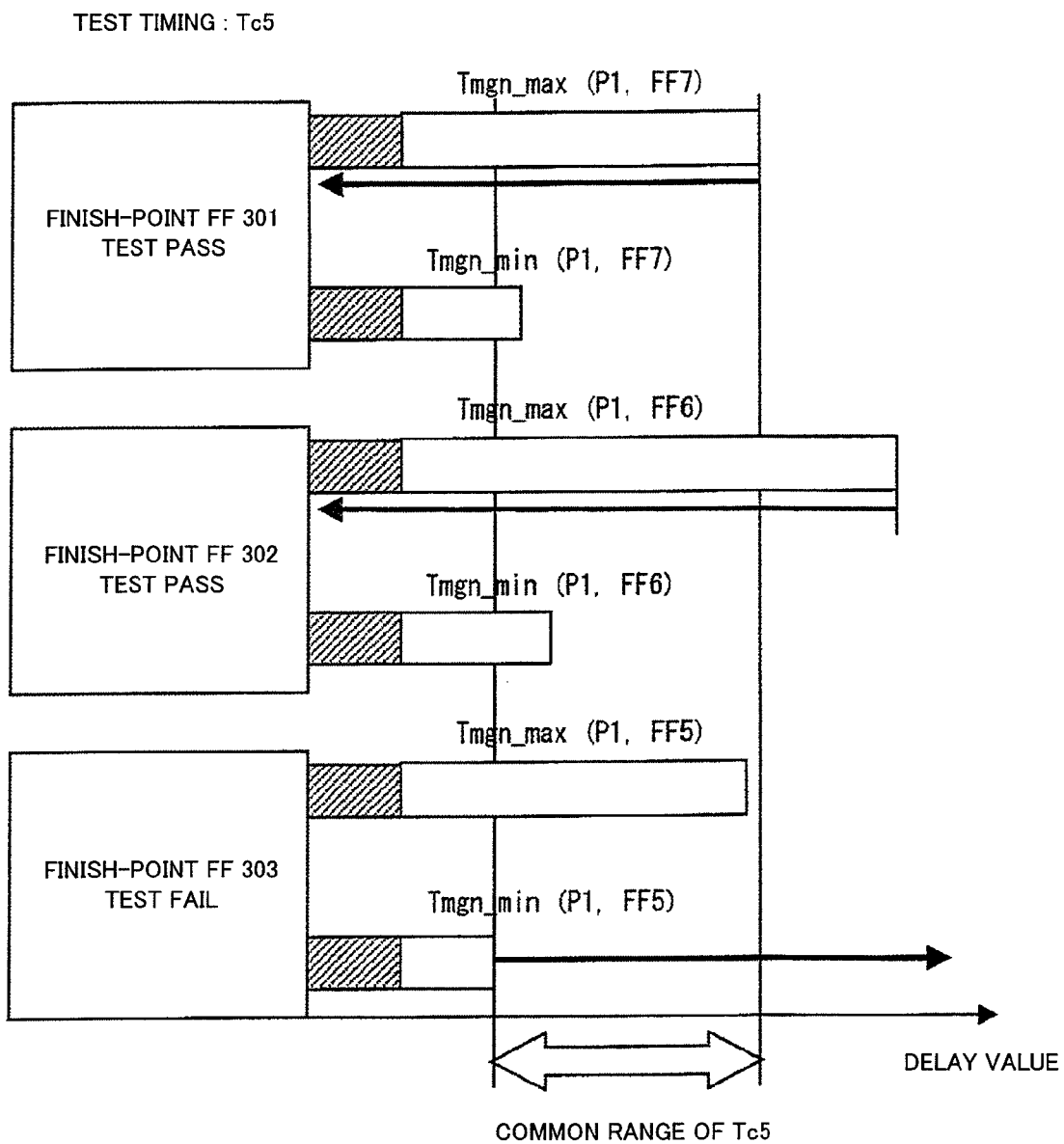
FIG. 19 shows a result of executing the process of FIG. 2 by using fail information of the test timing Tc5.

FIG. 19 shows the execution result of the process of FIG. 2 by using the fail information of the test timing Tc5. A hatched bar graph shows an increased margin from the delay margin of FIG. 14. Since the test timing Tc5 is larger than the test timing Tc3, the delay margin is also increased by the difference thereof. Further, since the test result shows that the finish-point FF 302 changes from the test pass/fail to the test pass, the delay range of the finish-point FF 302 changes. As a result, the common range of the delay range of each of the finish-point FFs 301 to 303 in the fault assumption P1 also changes.

Figure 20:
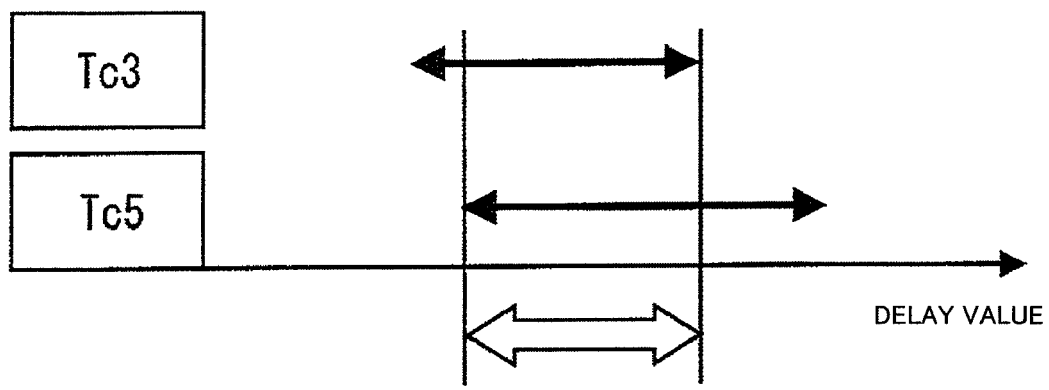
FIG. 20 shows a common range of test timings Tc3 and Tc5 and a new common range obtained from the test timings Tc3 and Tc5.

FIG. 20 shows the common range of the test timings Tc3 and Tc5 and a new common range obtained from the test timings Tc3 and Tc5. A black arrow shows the common range of each of the test timings obtained as a result of the process of FIG. 2. A white arrow shows a new common range obtained from the common range of the test timings Tc3 and Tc5. The range shown by the white arrow is narrower than the range of the single test timing. By superposing the common ranges of a plurality of test timings in this manner, the delay range of the delay fault can be further narrowed down.

Figure 21:
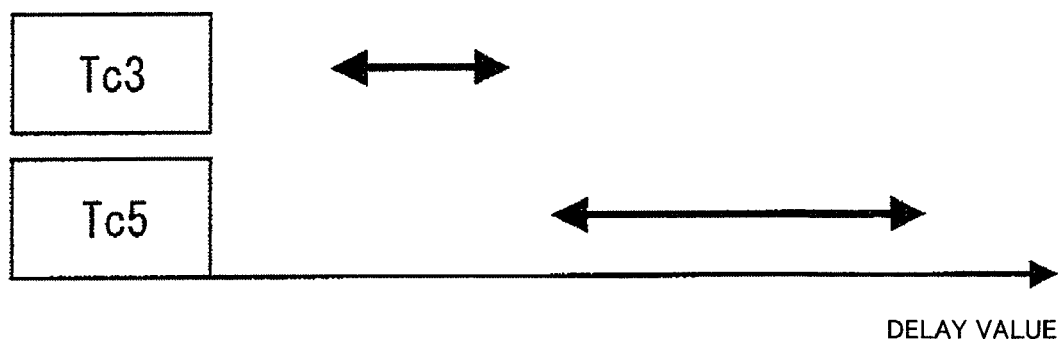
FIG. 21 shows the common range of the test timings Tc3 and Tc5 of the fault assumption different from that in FIG. 20.

FIG. 21 shows the common range of the test timings Tc3 and Tc5 of the fault assumption different from that in FIG. 20. Different from FIG. 20, no new common range exists in this fault assumption. This means that the fail information of a plurality of test timings cannot be explained by this fault assumption. Hence, it can be said that no delay fault exists in this fault assumption. By superposing the common ranges of a plurality of test timings in this manner, the fault candidate can be further narrowed down. In FIG. 21, though the fail information of the two test-timings has been used, more pieces of the fail information can be used. In that case, if even one common range which is not superposed exists, it can be said that no delay fault exists in that fault assumption.

<Effect of Second Embodiment>

Since a plurality of test timings are used in the second embodiment, the test time and process time of the fault diagnosis are increased compared with the first embodiment. However, in view of the narrowing down of the fault candidate and the delay range of the delay fault, the second embodiment is more advantageous than the first embodiment.

What is claimed is:

1. A fault diagnosis method, comprising:
providing a semiconductor integrated circuit device, the semiconductor integrated circuit device having first and second flip flops on an output side, a first scan chain in which the first and second flip flops are connected in series, input-side flip flops on an input side, a second scan chain in which the input-side flip flops are connected in series, and logic circuitry serving as test targets and obtained by connecting and combining a plurality of logic circuit elements, at least a portion of the logic circuitry being connected between corresponding input-side flip flops and the first and second flip flops, the logic circuitry being operated by supply of a test clock;

inputting a test pattern from a tester to the second scan chain through a scan chain input terminal provided in the semiconductor integrated circuit device;

outputting a test result to the tester from the first scan chain through a scan chain output terminal provided in the semiconductor integrated circuit device;

transmitting the test result to an information processing device from the tester;

reading out an expected value from a database by the information processing device, determining one of a complete match, a complete mismatch, and a partial match and partial mismatch between the test result and the expected value for each of the first and second flip flops in the first scan chain, and storing determination results thereof in the database;

reading out net list information stored in the database by the information processing device, setting a fault assumption where malfunction of the semiconductor integrated circuit device is assumed at a predetermined point in the logic circuitry, and extracting a plurality of first propagation routes each including the predetermined point in the route and the first flip flop as a finish-point and a plurality of second propagation routes each including the predetermined point in the route and the second flip-flop as a finish-point from signal propagation routes between the first and second flip flops and the input-side flip flops; and reading out delay information of wiring and the logic circuit elements stored in the database by the information processing device, determining a propagation time of the first propagation routes by adding up the delay information of the wiring and the logic circuit elements of the first propagation routes, determining a first delay margin for each of the first propagation routes by subtracting the propagation time from a time interval of the test clock, determining a propagation time of the second propagation routes by adding up the delay information of the wiring and the logic circuit elements of the second propagation routes, and determining a second delay margin for each of the second propagation routes by subtracting the propagation time from the time interval of the test clock, wherein a first transition time of a logic level of a signal at the predetermined point is determined to be shorter than a longest one of the first delay margins by the information processing device when the determination result associated with the first flip-flop is complete match, wherein the first transition time of the logic level of the signal at the predetermined point is determined to be longer than a shortest one of the first delay margins by the information processing device when the determination result associated with the first flip flop is complete mismatch, wherein the first transition time of the logic level of the signal at the predetermined point is determined to be shorter than the longest one of the first delay margins and the first transition time of the logic level of the signal at the predetermined point is determined to be longer than the shortest one of the first delay margins by the information processing device when the determination result associated with the first flip flop is partial match and partial mismatch, wherein a second transition time of the logic level of the signal at the predetermined point is determined to be shorter than a longest one of the second delay margins by the information processing device when the determination result associated with the second flip flop is complete match, wherein the second transition time of the logic level of the signal at the predetermined point is determined to be longer than a shortest one of the second delay margins by the information processing device when the determination result associated with the second flip flop is complete mismatch, wherein the second transition time of the logic level of the signal at the predetermined point is determined to be shorter than the longest one of the second delay margins and the second transition time of the logic level of the signal at the predetermined point is determined to be longer than the shortest one of the second delay margins by the information processing device when the determination result associated with the second flip flop is partial match and partial mismatch, and wherein it is determined that existence of a delay fault in one of the logic circuit elements associated with the predetermined point by the information processing device when there is a common range value of the first transition time and the second transition time, and it is determined no existence of delay fault in the one logic circuit element associated with the predetermined point by the information processing device when there is no common range value therebetween.

2. The fault diagnosis method according to claim 1, wherein the semiconductor integrated circuit device is operated by supplying the test clock at different time intervals.

3. A fault diagnosis computer program product comprised of a non-transitory computer-readable medium having stored thereon software instructions that, when executed by a processor, cause the processor to perform operations comprising:

a step of inputting a test pattern from a tester to a second scan chain of a semiconductor integrated circuit device through a scan chain input terminal, the semiconductor integrated circuit device having first and second flip flops on an output side, a first scan chain in which the first and second flip flops are connected in series, input-side flip flops on an input side, the second scan chain in which the input-side flip flops are connected in series, and logic circuitry serving as test targets and obtained by connecting and combining a plurality of logic circuit elements, at least a portion of the logic circuitry being connected between corresponding input-side flip flops and the first and second flip flops;

a step of operating the logic circuitry by supplying a test clock;

a step of outputting a test result to the tester from the first scan chain through a scan chain output terminal;

a step of transmitting the test result to an information processing device from the tester;

a step of reading out an expected value and the test result from a database by the information processing device, determining one of a complete match, a complete mismatch, and a partial match and a partial mismatch between the test result and the expected value for each of the first and second flip flops of the first scan chain, and storing a determination results thereof in the database;

a step of reading out net list information stored in the database by the information processing device, setting a fault assumption where malfunction of the semiconductor integrated circuit device is assumed at a predetermined point in the logic circuitry, and extracting a plurality of first propagation routes each including the predetermined point in the route and including the first flip flop as a finish-point and a plurality of second propagation routes each including the predetermined point as in the route and including the second FF as a finish-point from signal propagation routes between the first and second flip flops and the input-side flip flops;

a step of reading out delay information of wiring and the logic circuit elements stored in the database by the information processing device, determining a propagation time of the first propagation routes by adding up the delay information of the wiring and the logic circuit elements of the first propagation routes, determining a first delay margin for each of the first propagation routes by subtracting the propagation time from a time interval of the test clock, determining a propagation time of the second propagation routes by adding up the delay information of the wiring and the logic circuit elements of the second propagation routes, and determining a second delay margin for each of the second propagation routes by subtracting the propagation time from the time interval of the test clock;

a step of determining a first transition time of a logic level of a signal at the predetermined point to be shorter than a longest one of the first delay margins by the information processing device when the determination result associated with the first flip flop is complete match;

a step of determining the first transition time of the logic level of the signal at the predetermined point to be longer than a shortest one of the first delay margins by the information processing device when the determination result associated with the first flip flop is complete mismatch;

a step of determining a first transition time of the logic level of the signal at the predetermined point to be shorter than the longest one of the first delay margins and determining the first transition time of the logic level of the signal at the predetermined point to be longer than the shortest one of the first delay margins by the information processing device when the determination result associated with the first flip flop is partial match and partial mismatch, a step of determining a second transition time of the logic level of the signal at the predetermined point to be shorter than a longest one of the second delay margins by the information processing device when the determination result associated with the second flip flop is complete match;

a step of determining the second transition time of the logic level of the signal at the predetermined point to be longer than the shortest one of the second delay margins by the information processing device when the determination result in the second flip flop is complete mismatch;

a step of determining the second transition time of the logic level of the signal at the predetermined point to be shorter than the longest one of the second delay margins and the second transition time of the logic level of the signal at the predetermined point to be longer than the shortest one of the second delay margins by the information processing device when the determination result associated with the second flip flop is partial match and partial mismatch; and a step of determining existence of a delay fault in one of the logic circuit elements associated with the predetermined point by the information processing device when there is a common range value for the first transition time and the second transition time and determining no existence of delay fault in the one logic circuit element associated with the predetermined point by the information processing device when there is no common range value therebetween.

4. The fault diagnosis program according to claim 3, wherein the semiconductor integrated circuit device is operated by supplying the test clock at different time intervals.

5. A fault diagnosis system, comprising:

an information processing device including a tester and a database, wherein a test pattern is input from the tester to a second scan chain of a semiconductor integrated circuit device through a scan chain input terminal, the semiconductor integrated circuit device having first and second flip flops on an output side, a first scan chain in which the first and second flip flops are connected in series, input-side flip flops on an input side, the second scan chain in which the input-side flip flops are connected in series, and logic circuitry serving as test targets and obtained by connecting and combining a plurality of logic circuit elements, at least a portion of the logic circuitry being connected between corresponding input-side flip flops and the first and second flip flops, the logic circuitry being operated by supply of a test clock, a test result is output to the tester from the first scan chain through a scan chain output terminal, the test result is transmitted to the information processing device from the tester, an expected value is read out from a database by the information processing device, one of a complete match, a complete mismatch, and a partial match and partial mismatch between the test result and the expected value is determined for each of the first and second flip flop of the first scan chain, and a determination result is stored in the database, net list information stored in the database is read out by the information processing device, a fault assumption where malfunction of the semiconductor integrated circuit device is assumed at a predetermined point in the logic circuitry is set, and a plurality of first propagation routes each including the predetermined point in the route and including the first flip flop, as a finish-point and a plurality of second propagation routes each including the predetermined in the route and including the second flip flop as a finish-point are extracted from signal propagation routes between the first and second flip flops and the input-side flip flops, delay information of wiring and the logic circuit elements stored in the database is read out by the information processing device, a propagation time of the first propagation routes is determined by adding up the delay information of the wiring and the logic circuit elements of the first propagation routes, a first delay margin is determined for each of the first propagation routes by subtracting the propagation time from a time interval of the test clock, a propagation time of the second propagation routes is determined by adding up the delay information of the wiring and the logic circuit elements of the second propagation routes, and a second delay margin is determined for each of the second propagation routes by subtracting the propagation time from the time interval of the test clock, a first transition time of a logic level of a signal at the predetermined point is determined to be shorter than a longest one of the first delay margins by the information processing device when the determination result associated with the first flip flop is complete match, the first transition time of the logic level of the signal at the predetermined point is determined to be longer than a shortest one of the first delay margins by the information processing device when the determination result in the first flip flop is complete mismatch, the first transition time of the logic level of the signal at the predetermined point is determined to be shorter than the longest one of the first delay margins and the first transition time of the logic level of the signal at the predetermined point is determined to be longer than the shortest one of the first delay margins by the information processing device when the determination result associated with the first flip flop is partial match and partial mismatch, a second transition time of the logic level of the signal at the predetermined point is determined to be shorter than a longest one of the second delay margins by the information processing device when the determination result associated with the second flip flop is complete match, the second transition time of the logic level of the signal at the predetermined point is determined to be longer than a shortest one of the second delay margins by the information processing device when the determination result associated with the second flip flop is complete mismatch, the second transition time of the logic level of the signal at the predetermined point is determined to be shorter than the longest one of the second delay margins and the second transition time of the logic level of the signal at the predetermined point is determined to be longer than the shortest one of the second delay margins by the information processing device when the determination result associated with the second flip flop is partial match and partial mismatch, and existence of a delay fault in one of the logic circuit elements associated with the predetermined point is determined by the information processing device when there is a common range value for the first transition time and the second transition time and non-existence of delay fault in the one logic circuit element associated with the predetermined point is determined by the information processing device when there is no common range value therebetween.

6. The fault diagnosis system according to claim 5, wherein the semiconductor integrated circuit device is operated by supplying the test clock at different time intervals.

* * * * *